United States Patent
Singh et al.

(10) Patent No.: US 7,634,195 B2
(45) Date of Patent: *Dec. 15, 2009

(54) DIGITAL OPTICAL NETWORK ARCHITECTURE

(75) Inventors: Jagdeep Singh, Los Gatos, CA (US); Drew Perkins, Saratoga, CA (US); David F. Welch, Atherton, CA (US); Mark Yin, Cupertino, CA (US); Fred A. Kish, Jr., Palo Alto, CA (US); Stephen G. Grubb, Reisterstown, MD (US); Robert R. Taylor, Charleston, SC (US); Vincent G. Dominic, Dayton, OH (US); Matthew L. Mitchell, Monte Sereno, CA (US); James R. Dodd, Jr., Palo Alto, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/938,761

(22) Filed: Nov. 12, 2007

(65) Prior Publication Data
US 2008/0063407 A1 Mar. 13, 2008

Related U.S. Application Data

(62) Division of application No. 10/267,212, filed on Oct. 8, 2002, now Pat. No. 7,295,783.

(51) Int. Cl.
*H04J 14/02* (2006.01)

(52) U.S. Cl. .............................. 398/79; 398/82; 398/43

(58) Field of Classification Search .................. 398/79, 398/82, 43, 68, 87
See application file for complete search history.

(56) References Cited

U.S. PATENT DOCUMENTS 5,355,237 A * 10/1994 Lang et al. ..................... 385/14
7,283,694 B2 * 10/2007 Welch et al. .................. 385/14

* cited by examiner

*Primary Examiner*—M. R. Sedighian
(74) *Attorney, Agent, or Firm*—W. Douglas Carothers, Jr.; Bradford Goodson

(57) ABSTRACT

A digital optical network (DON) is a new approach to low-cost, more compact optical transmitter modules and optical receiver modules for deployment in optical transport networks (OTNs). One important aspect of a digital optical network is the incorporation in these modules of transmitter photonic integrated circuit (TxPIC) chips and receiver photonic integrated circuit (TxPIC) chips in lieu of discrete modulated sources and detector sources with discrete multiplexers or demultiplexers.

9 Claims, 13 Drawing Sheets

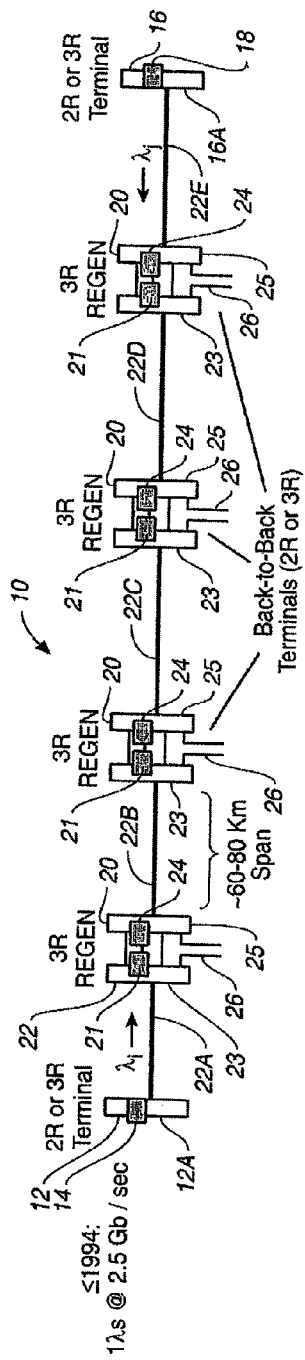
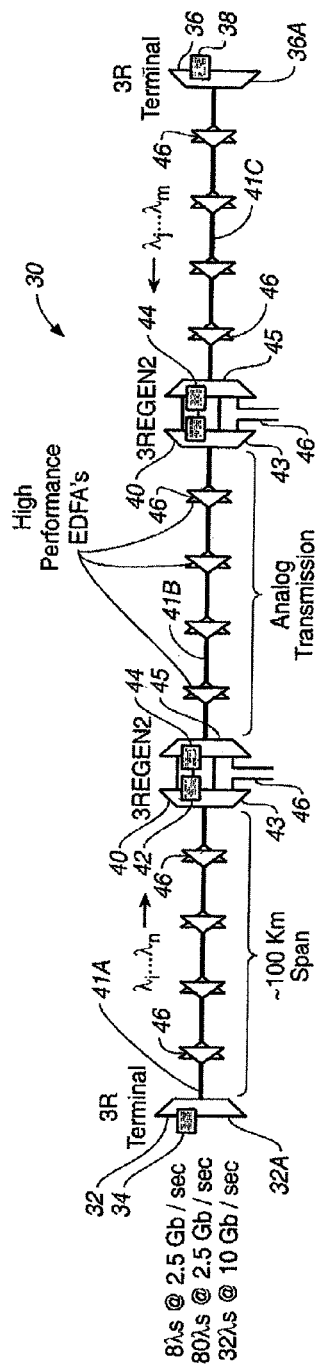
FIG._1 (PRIOR ART)
FIG._2 (PRIOR ART)

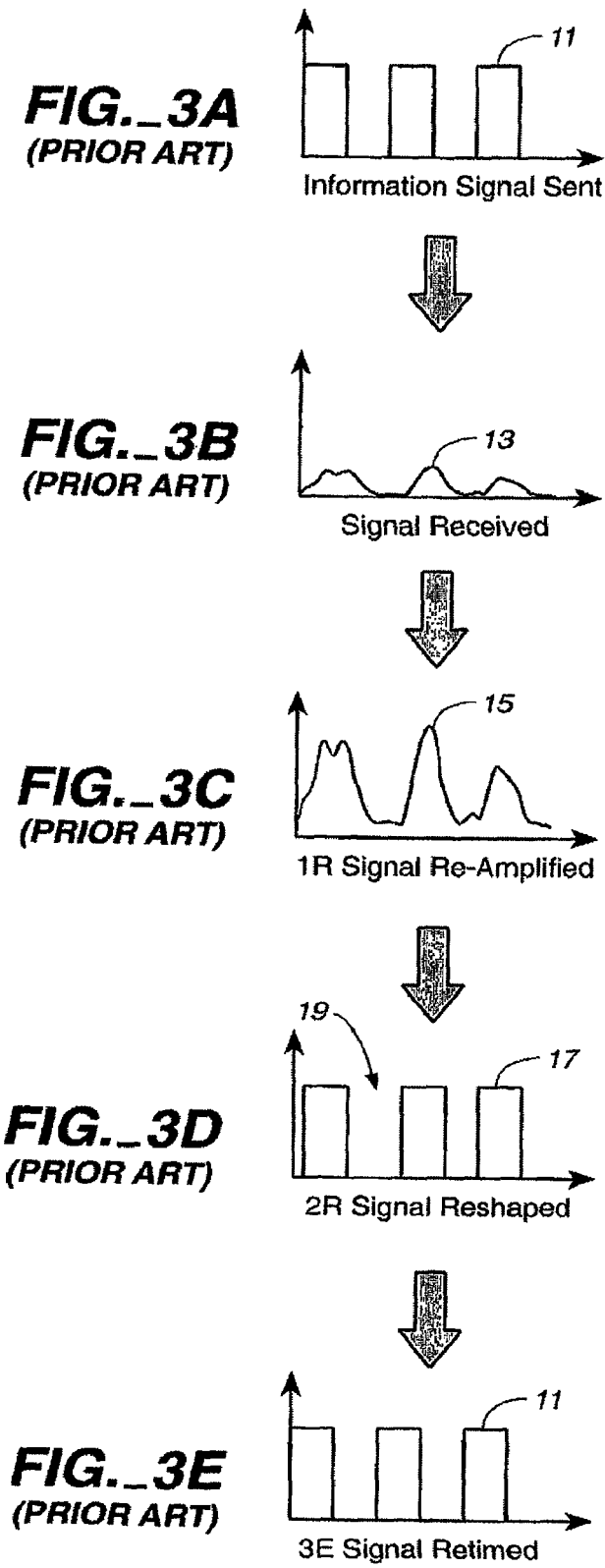

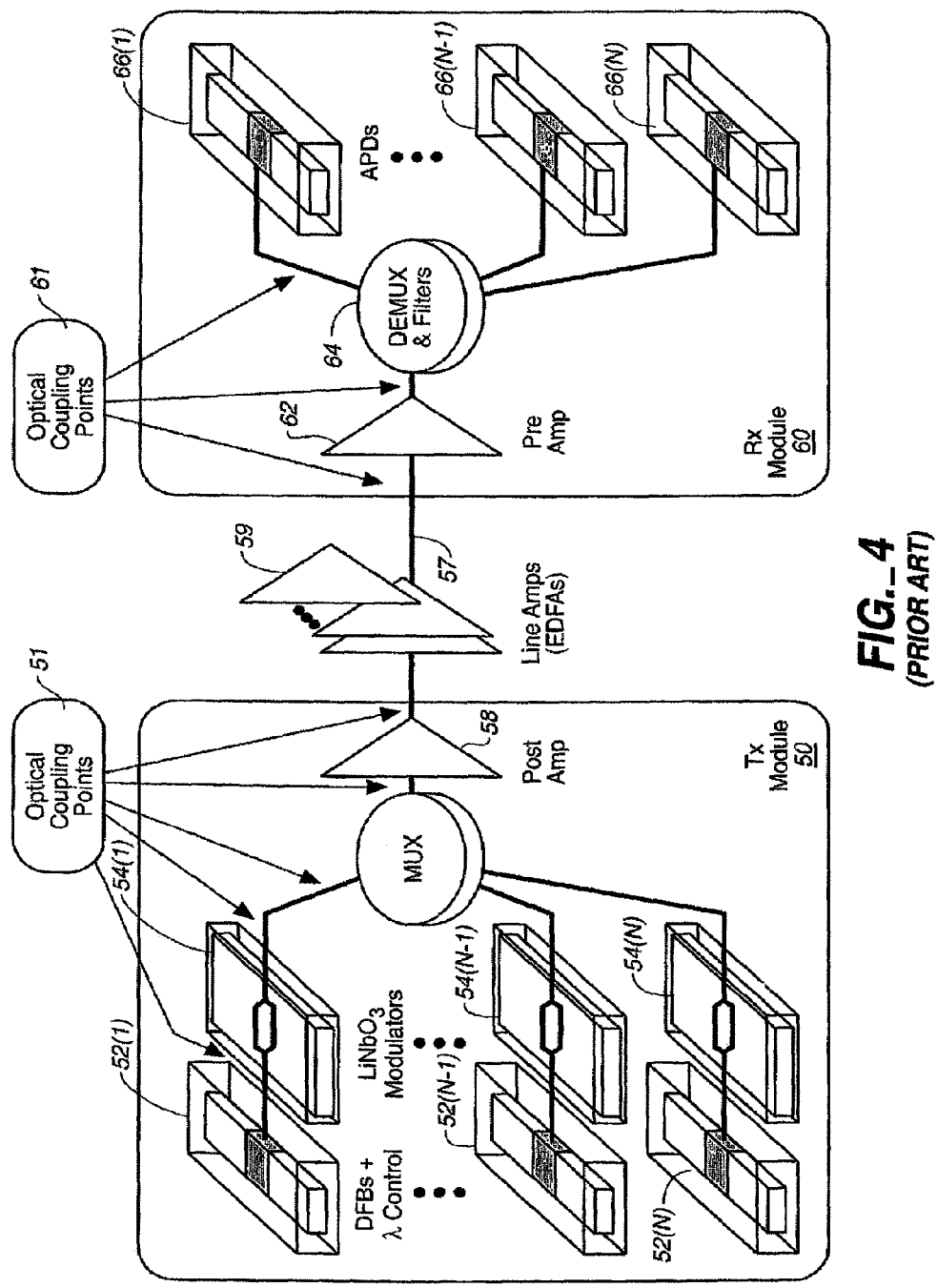
FIG._4
*(PRIOR ART)*

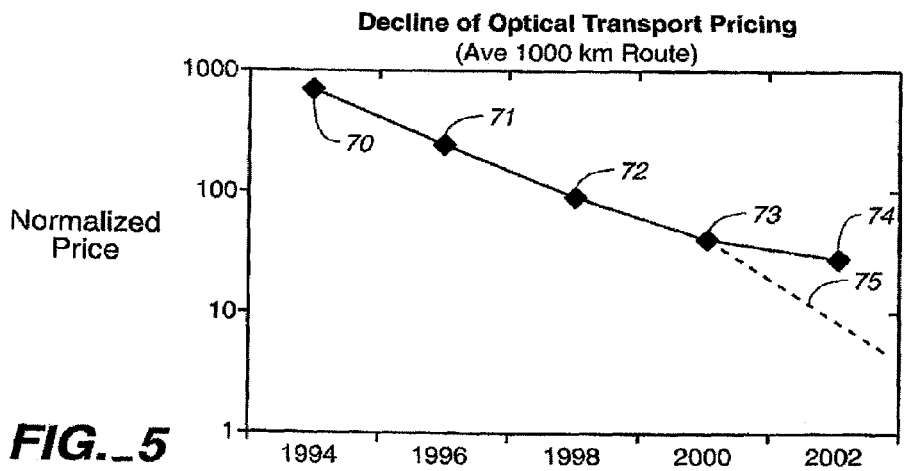
FIG._5
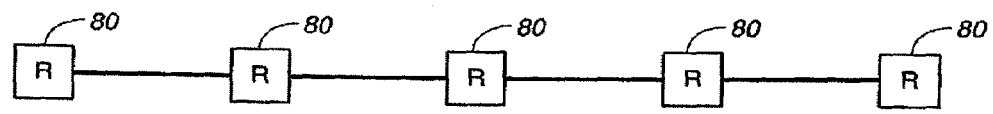
FIG._6A
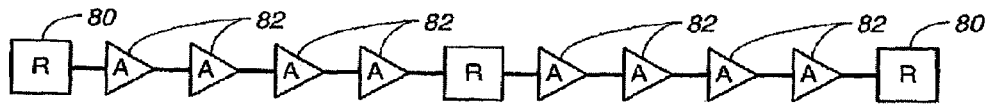
FIG._6B
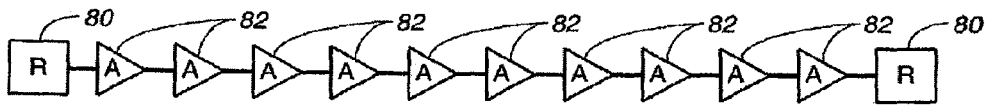
FIG._6C
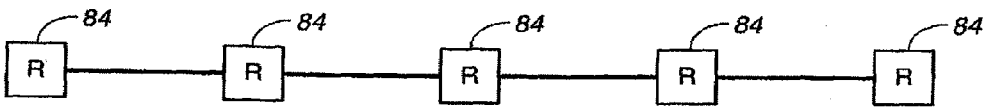
FIG._6D

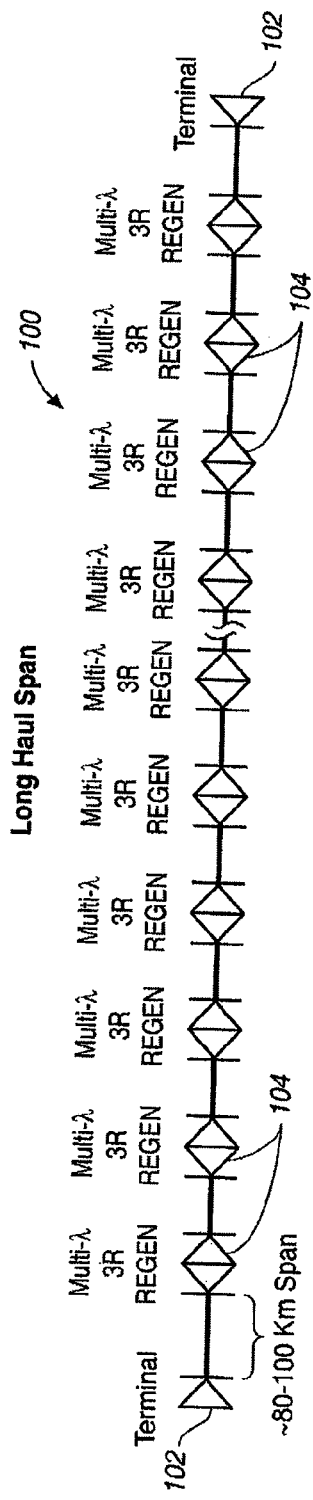
FIG._7
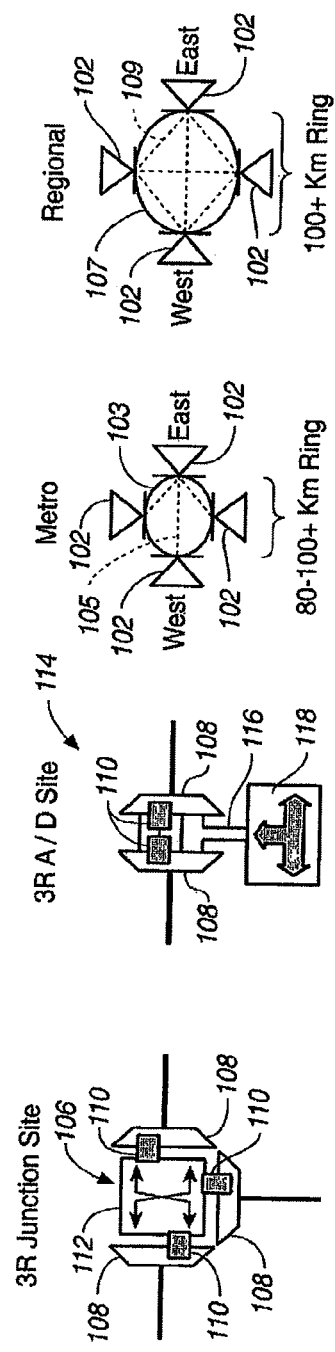
FIG._11
FIG._10
FIG._9
FIG._8

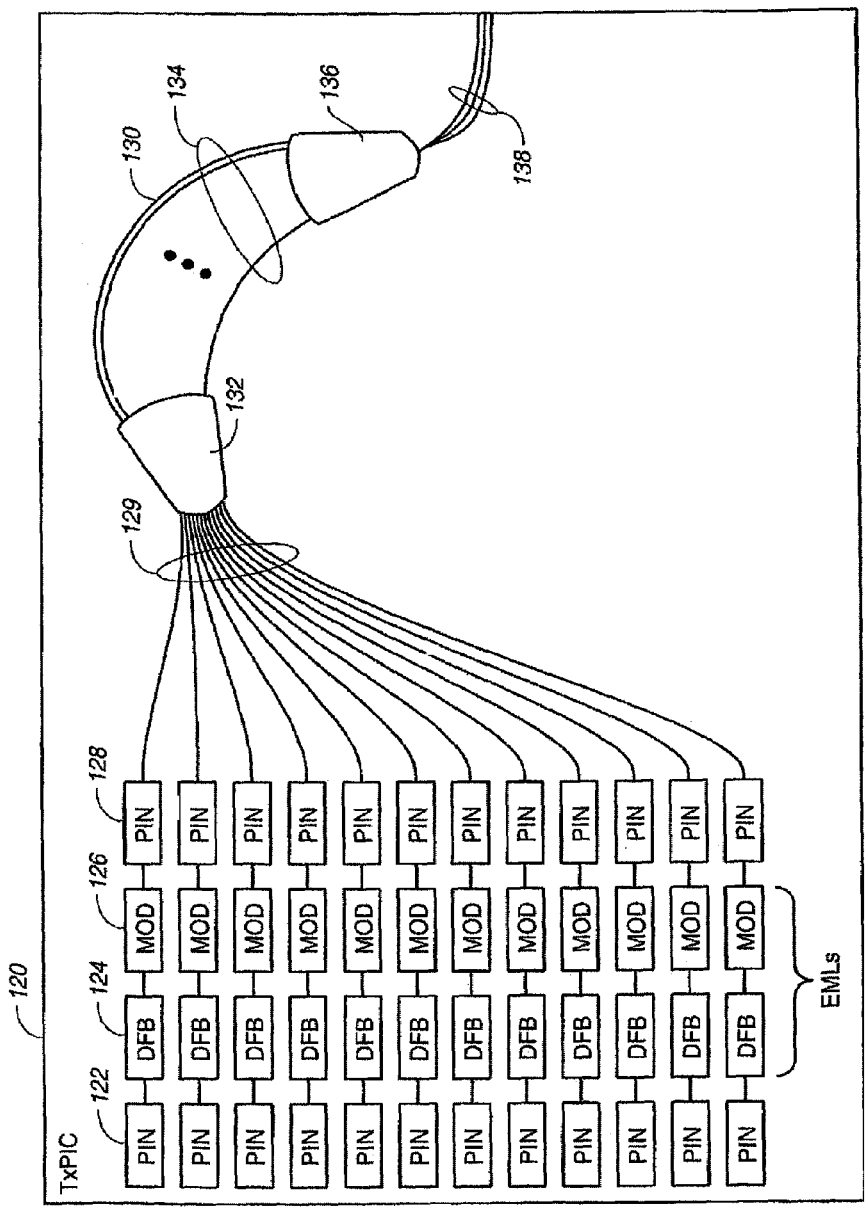
FIG._12

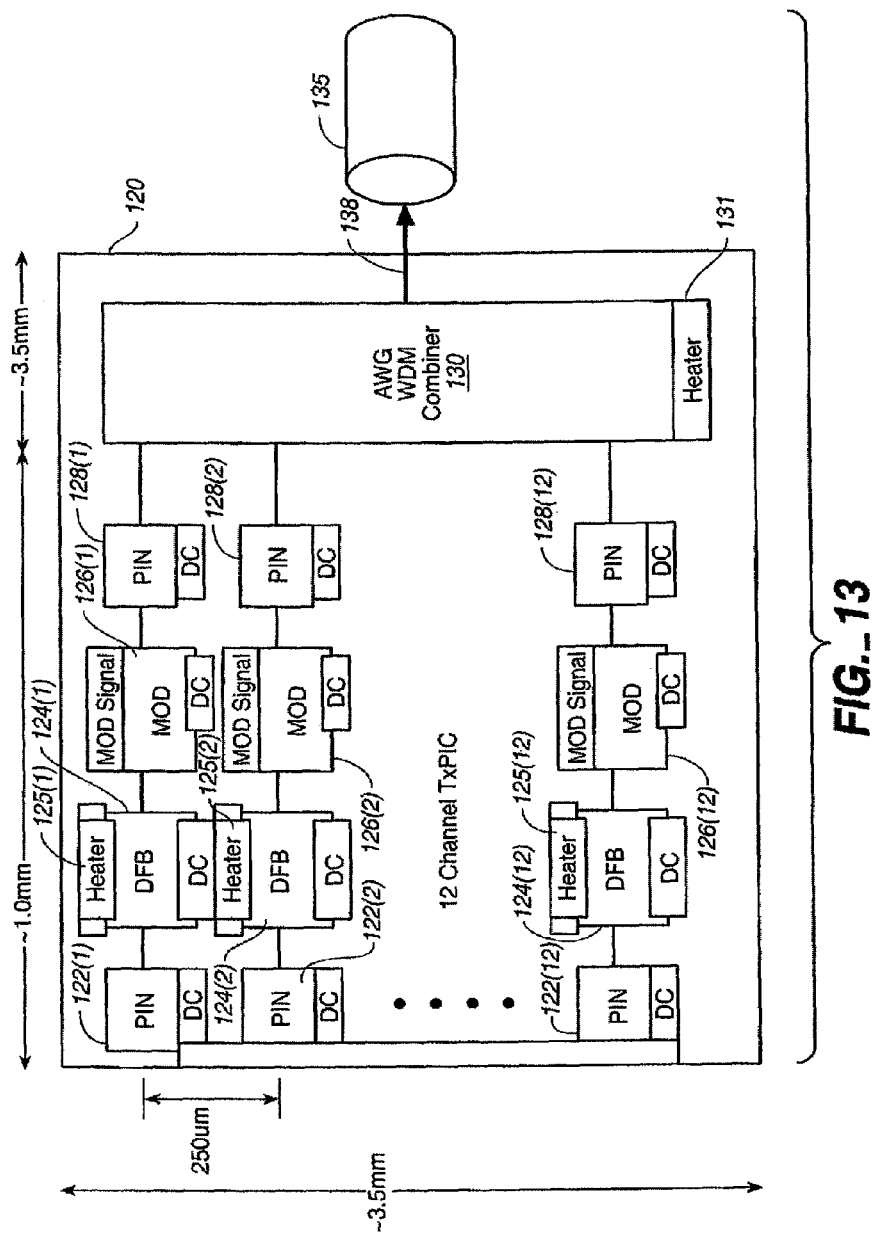
FIG._13

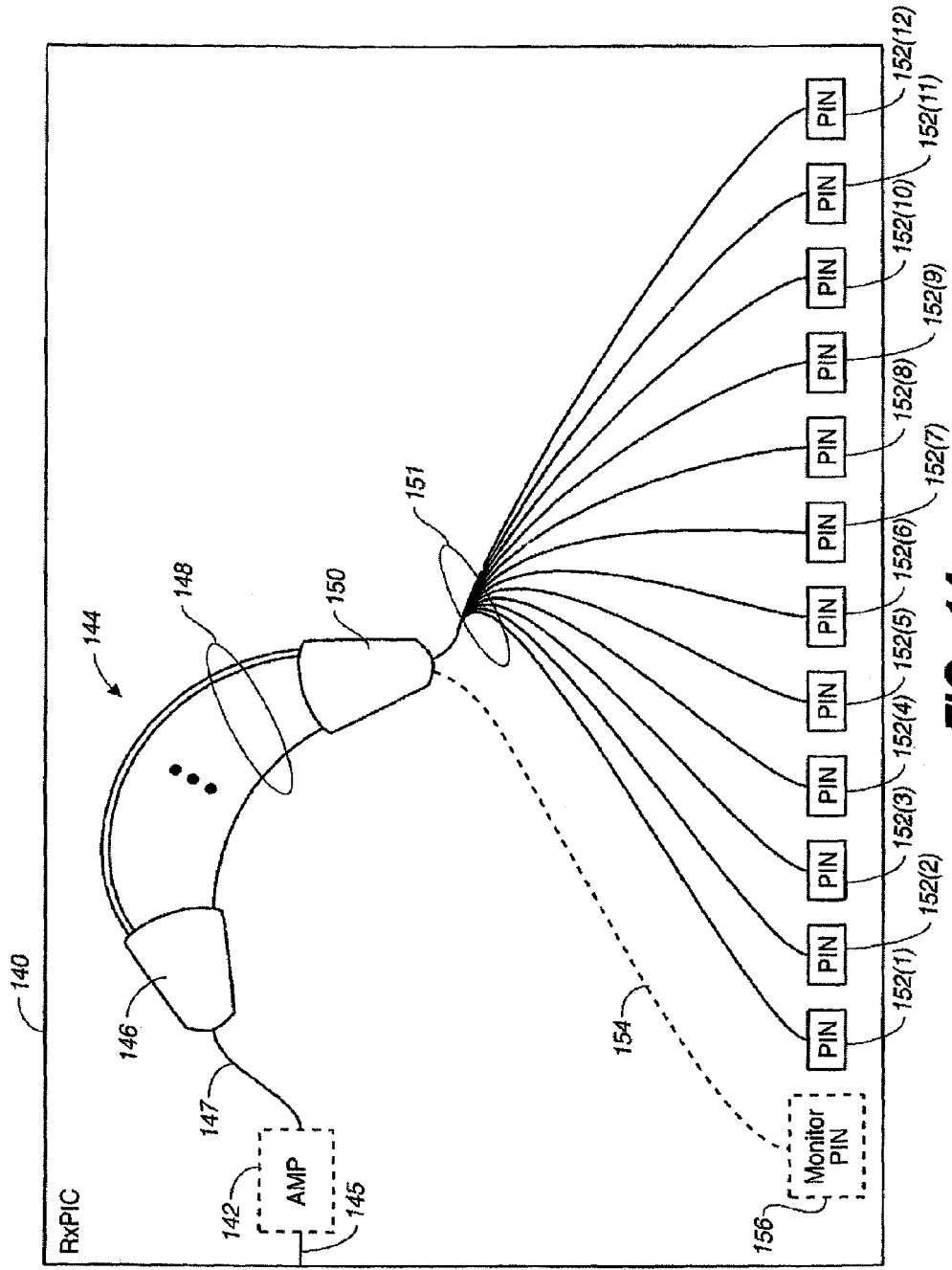
FIG._14

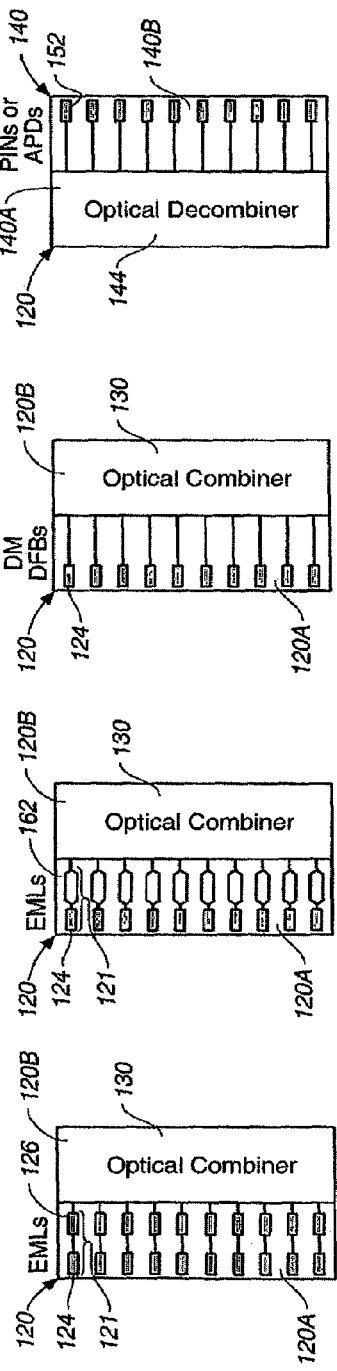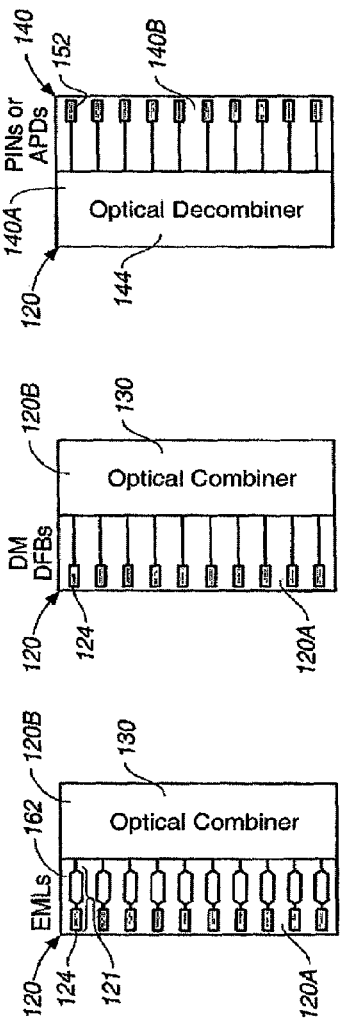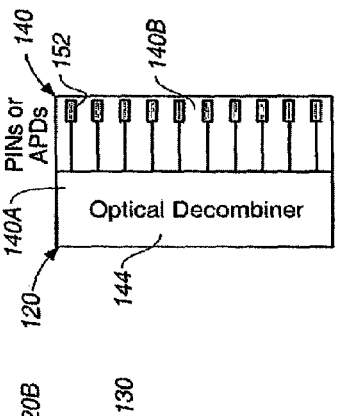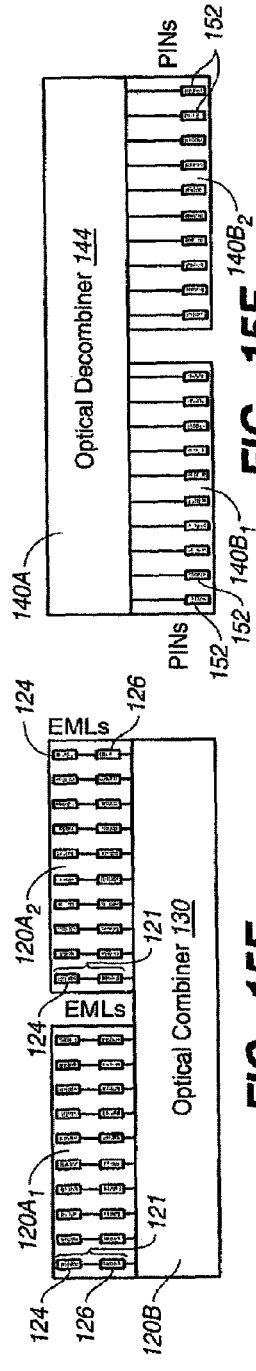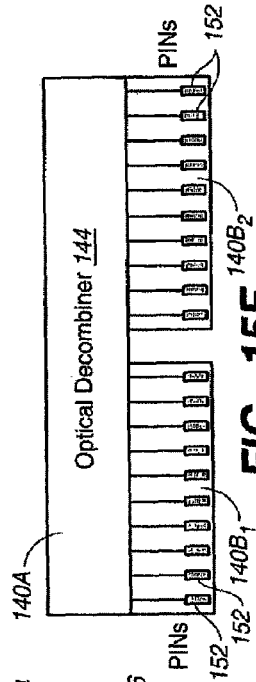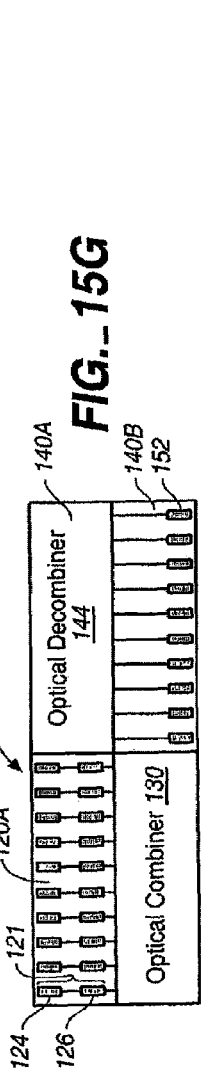

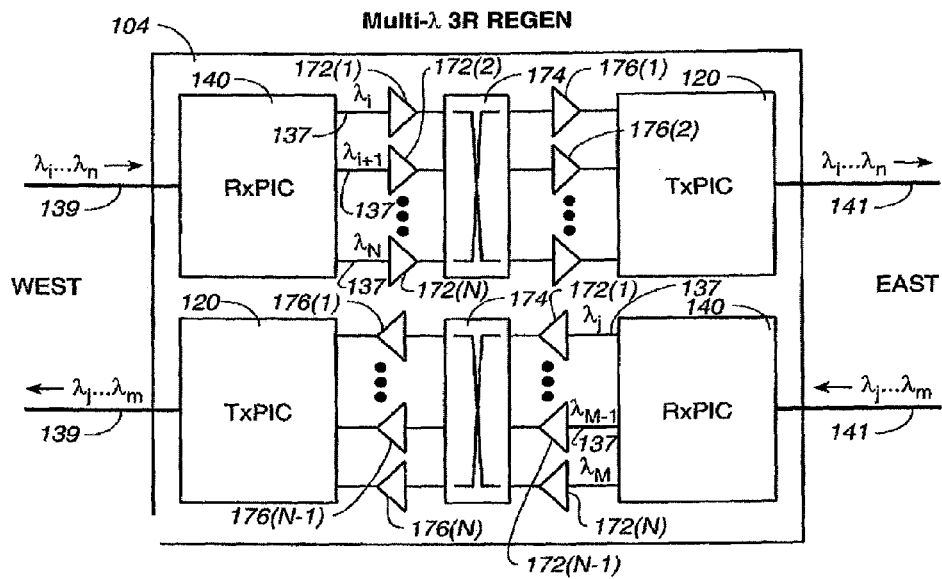
FIG._16
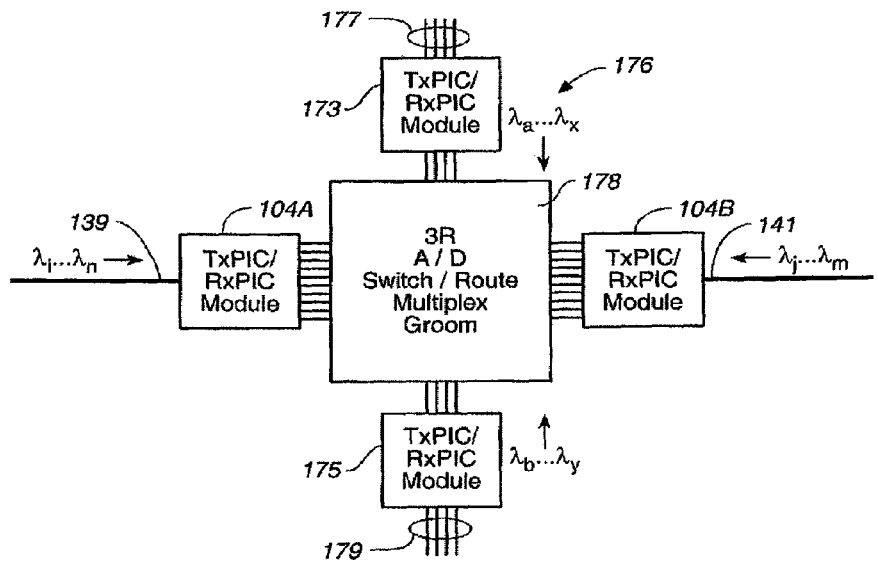
FIG._17

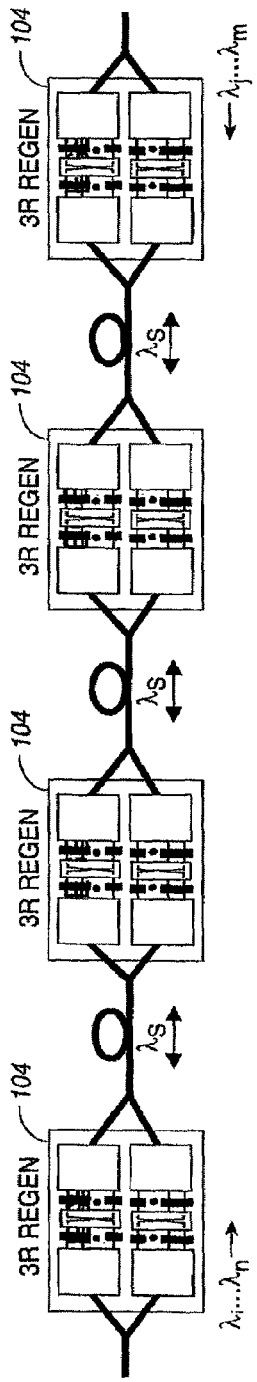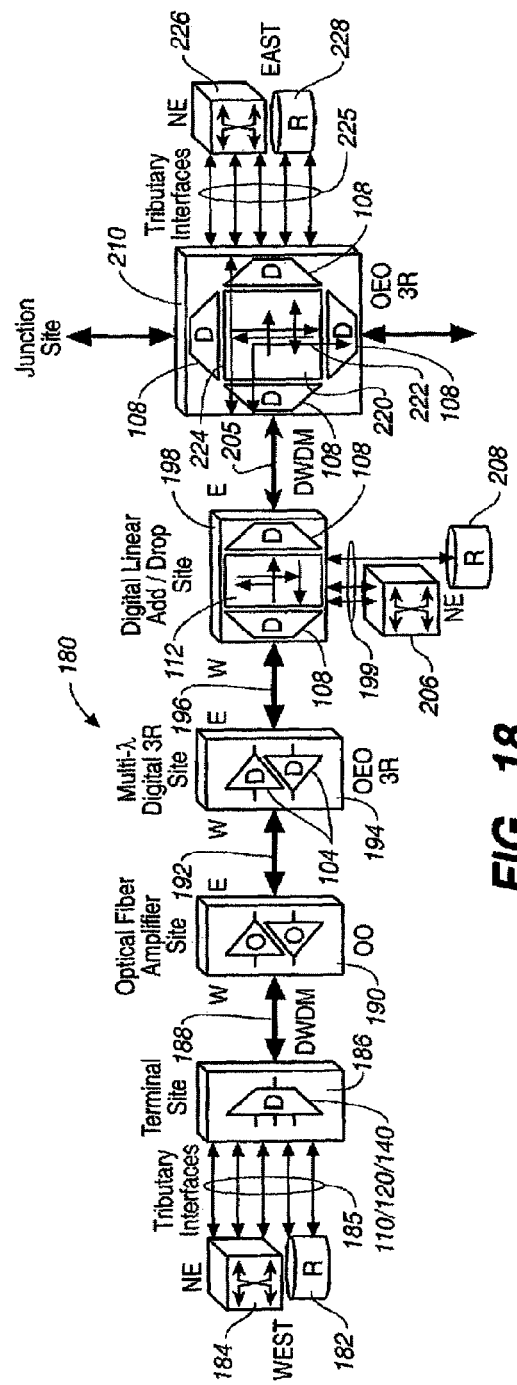

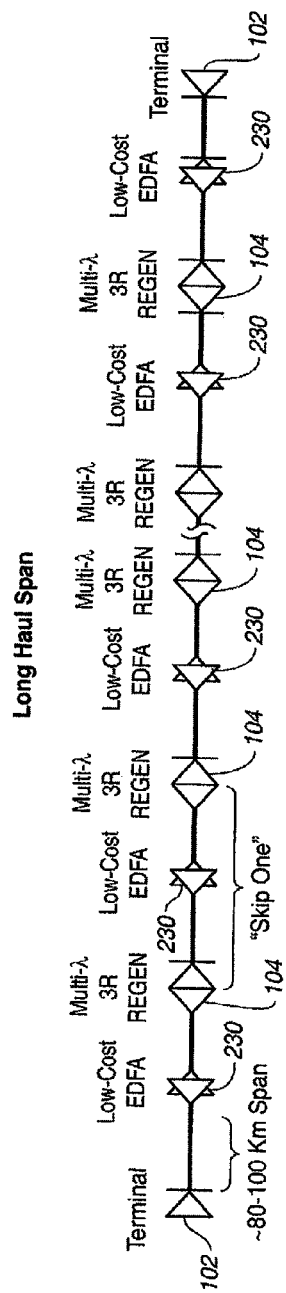
FIG._19
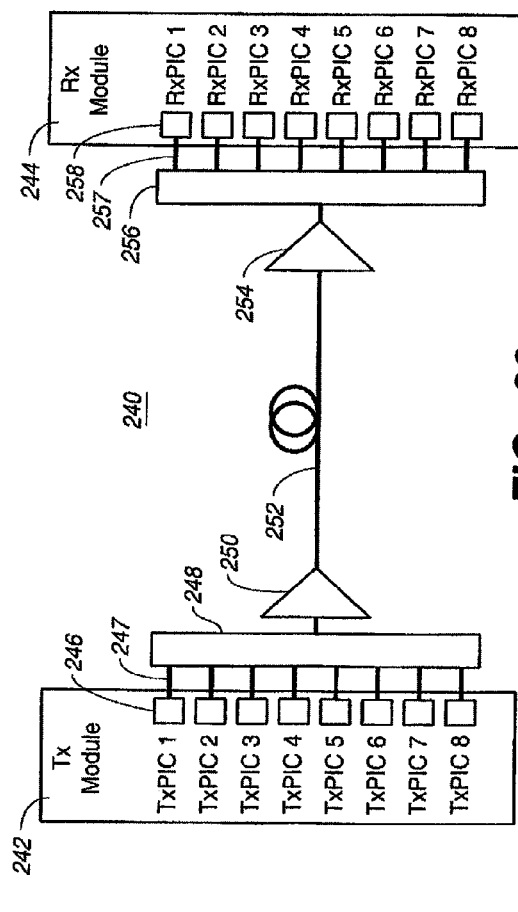
FIG._20

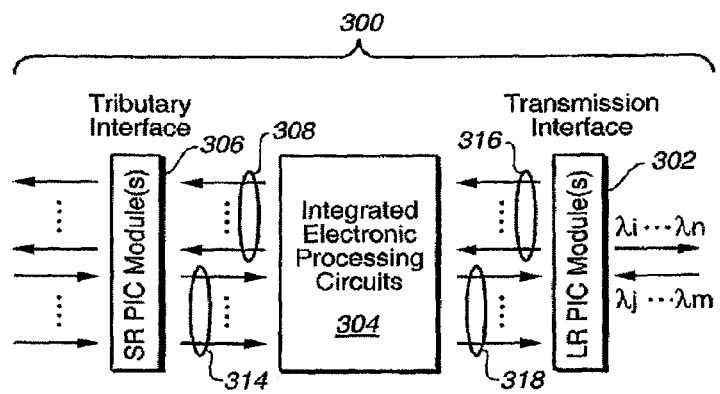
FIG._21
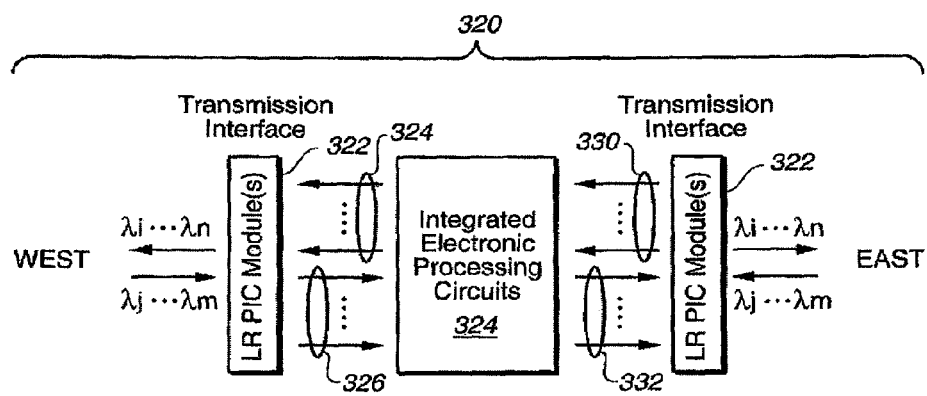
FIG._22

DIGITAL OPTICAL NETWORK ARCHITECTURE

CROSS REFERENCE TO RELATED APPLICATIONS

This application is a divisional application of U.S. application Ser. No. 10/267,212, filed Oct. 8, 2002 and entitled, DIGITAL OPTICAL NETWORK ARCHITECTURE, which claims priority to provisional application Ser. No. 60/328,207, filed Oct. 9, 2001 and entitled, PHOTONIC INTEGRATED CIRCUITS FOR DWDM OPTICAL NETWORKS, part of U.S. nonprovisional application Ser. No. 10/267,331, filed Oct. 8, 2002 and issued on Oct. 16, 2007 as U.S. Pat. No. 7,283,694; Ser. No. 60/328,332, filed Oct. 9, 2001 and entitled, APPARATUS AND METHOD OF WAVELENGTH LOCKING IN AN OPTICAL TRANSMITTER SYSTEMS, part of U.S. nonprovisional application Ser. No. 10/267,331, further identified above; Ser. No. 60/370,345, filed Apr. 5, 2002 and entitled, WAVELENGTH STABILIZATION IN TRANSMITTER PHOTONIC INTEGRATED CIRCUITS (TxPICs), part of U.S. nonprovisional application Ser. No. 10/267,330, filed Oct. 8, 2002 and issued on Jul. 18, 2006 as U.S. Pat. No. 7,079,715; Ser. No. 60/367,595, filed Mar. 25, 2002 and entitled, AN OPTICAL RECEIVER PHOTONIC INTEGRATED CIRCUIT (RxPIC), AN ASSOCIATED OPTICAL SIGNAL TRANSMITTER PHOTONIC INTEGRATED CIRCUIT (TxPIC) AND AN OPTICAL NETWORK TRANSMISSION SYSTEM UTILIZING THESE CIRCUITS, part of U.S. nonprovisional application Ser. No. 10/267,304, filed Oct. 8, 2002 and issued Oct. 3, 2006 as U.S. Pat. No. 7,116,851; and Ser. No. 60/378,010, filed May 10, 2002 and entitled, TRANSMITTER PHOTONIC INTEGRATED CIRCUIT (TxPIC) CHIP WITH ENHANCED POWER AND YIELD WITHOUT ON-CHIP AMPLIFICATION, part of U.S. nonprovisional application Serial No. 10/267,346, filed Oct. 8, 2002 and issued on Jun. 6, 2006 as U.S. Pat. No. 7,058,246, all of which are owned by the assignee herein and are incorporated herein by their reference.

BACKGROUND OF THE INVENTION

1. Field of the Invention

This invention relates generally to optical transport networks and more particularly to a new architecture for optical transport networks that deploys low cost, highly compact optical-electrical-optical (OEO) regeneration (REGEN) modules and terminals compared to those presently known or deployed today.

2. Description of the Related Art

If used throughout this description and the drawings, the following short terms have the following meanings unless otherwise stated:

1R—Re-amplification of the information signal.
2R—Optical signal regeneration that includes signal reshaping as well as signal regeneration or re-amplification.
3R—Optical signal regeneration that includes signal retiming as well as signal reshaping as well as regeneration or re-amplification.
4R—Any electronic reconditioning to correct for transmission impairments other than 3R processing, such as, but not limited to, FEC encoding, decoding and re-encoding.
A/D—Add/Drop.
APD—Avalanche Photodiode.
AWG—Arrayed Waveguide Grating.
BER—Bit Error Rate.
CD—Chromatic Dispersion.
CDWM—Cascaded Dielectric Wavelength Multiplexer (Demultiplexer).
CWDM—Coarse Wavelength Division Multiplexing—transmission of data on more than one wavelength in a given direction on a grid of spacing greater than 200 GHz.
DBR—Distributed Bragg Reflector laser.
EDFAs—Erbium Doped Fiber Amplifiers.
DAWN—Digitally Amplified Wavelength Network.
DCE—Dispersion Compensating Elements either for CD, such as DCFs, dispersion managed solitons, frequency guiding filtering, chirped fiber Bragg gratings, or dispersion slope compensation, or for PMD, such as through optical device design to achieve polarization insensitivity or equalization optical circuitry to provide distorted optical signal polarization transformation.
DCF—Dispersion Compensating Fiber.
DEMUX—Demultiplexer.
DFB—Distributed Feedback laser.
DCF—Dispersion Compensating Fiber.
Digital OEO REGEN—an OEO REGEN that provides complete digital handling of channel signals including their regeneration in a digital optical network without deployment or need for analog optical components including optical fiber amplifiers.
DM—Direct Modulation.
DON—Digital Optical Network as defined and disclosed in this application.
DWDM—Dense Wavelength Division Multiplexing—transmission of data on more than one wavelength in a given direction on a grid of spacing less than or equal to 200 GHz.
EDFA—Erbium Doped Fiber Amplifier
EML—Electro-absorption Modulator/Laser.
EO—Electrical to Optical signal conversion (from the electrical domain into the optical domain).
FEC—Forward Error Correction.
GVD—Group Velocity Dispersion comprising CD and/or PMD.
ITU—International Telecommunication Union.
MMI—Multimode Interference combiner.
Modulated Sources—EMLs or SMLs, combinations of lasers and external modulators or DM lasers.
LR—Long Reach.
MZM—Mach-Zehnder Modulator.
MUX—Multiplexer.
NE—Network Element.
NF—Noise Figure: The ratio of output OSNR to input OSNR.
OADM—Optical Add Drop Multiplexer.
OE—Optical to Electrical signal conversion (from the optical domain into the electrical domain).
OEO—Optical to Electrical to Optical signal conversion (from the optical domain into the electrical domain with electrical signal regeneration and then converted back into optical domain) and also sometimes referred to as SONET regenerators.
OEO REGEN—OEO signal REGEN is OEO conversion wherein the signal is regenerated in the electronic domain between conversions to the optical domain. SONET regenerators are one example of OEO REGEN but it is not limited to such regenerators.
OO—Optical-Optical for signal re-amplification due to attenuation. EDFAs do this in current WDM systems.
OOO—Optical to Optical to Optical signal conversion (receiving in the optical domain, processing in the optical domain, and transmitting in the optical domain, without conversion of the signal to the electrical domain).

OOO-REGEN—OOO signal REGEN using all-optical regeneration.

OSNR—Optical Signal to Noise Ratio.

PIC—Photonic Integrated Circuit.

PIN—p-i-n semiconductor photodiode.

PMD—Polarization Mode Dispersion.

REGEN—optical signal regeneration or regenerator is signal restoration, accomplished electronically or optically or a combination of both, which is required due to both optical signal degradation or distortion primarily occurring during optical signal propagation caused by the nature and quality of the signal itself or due to optical impairments incurred on the optical transport medium.

Rx—Receiver, here in reference to optical channel receivers.

RxPIC—Receiver Photonic Integrated Circuit.

SDH—Synchronous Digital Hierarchy.

SDM—Space Division Multiplexing.

Signal regeneration (regenerating)—Also, may be referred to as signal rejuvenation. This may entail 1R, 2R, 3R or 4R and in a broader sense signal A/D multiplexing, switching, routing, grooming, wavelength conversion as discussed, for example, in the book entitled, "Optical Networks" by Rajiv Ramaswami and Kumar N. Sivarajan, Second Edition, Morgan Kaufmann Publishers, 2002.

SOA—Semiconductor Optical Amplifier.

SONET—Synchronous Optical Network.

SR—Short Reach.

TDM—Time Division Multiplexing.

Tx—Transmitter, here in reference to optical channel transmitters.

TxPIC—Transmitter Photonic Integrated Circuit.

VOA—Variable Optical Attenuator.

VMPD—Velocity-Matched Distributed Photodetector.

WDM—Wavelength Division Multiplexing—transmission of data on more than one wavelength in a given direction.

The landscape of optical transport networks has changed significantly over the past ten years. Prior to that time, most long haul telecommunications were generally handled via electrical domain transmission, such as provided through wire cables, which are bandwidth limited. Telecommunication service providers since about 1990 have vastly higher information or data transmission capability particularly in bandwidth compared to traditional electrical/electronic transport networks. Capacity demands now have increased significantly with the advent of the Internet which has been said to bring about six times, and probably more, as much traffic into a network compared to electrical domain transmission. The demand for information signal capacity increases dramatically every year.

Optical transport networks deployed prior to 1994 were time division multiplexing (TDM) or space division multiplexing (SDM) where optical data signal at a single wavelength or at a different wavelength were each transported in a single fiber in opposite directions such as 1300 nm in one direction and 1500 nm in the other direction. This type of network 10 is shown in FIG. 1. In FIG. 1, the information signal, for example, to be transmitted in the optical domain is received in terminal 12 electronically via linecard 14 and converted to the optical domain for transmission on an optical fiber link, via an optical module 12A by either direct modulation of a discrete semiconductor laser, such as a DFB laser, or by external modulation using an optical modulator, such as a discrete Mach-Zehnder modulator (MZM) receiving light from a discrete, CW operated DFB or DBR laser. Optical module 12 also may include an optical receiver for channel signals propagated in an opposite direction from terminal 16. These discrete optical components are optically aligned at the factory and provided in a package 12A and mounted in association with linecard 14 as a module on a mother board, for example, for insertion into a transmission rack at a facility of the service provider.

The modulated optical signal is then transported on a first optical link 22A generally for a distance of about 60-80 km where the signal has become so deteriorated or degraded in quality (depending, in part, the type of fiber medium in use) that regeneration or REGEN of the optically propagating signal was necessary, e.g., the signal must be converted back into the electrical domain, digitally re-amplified, reshaped and/or retimed (2R or 3R) and then reconverted back into the optical domain (OEO) for transmission on the next optical link 22B. Such OEO REGENs 20, as shown along optical span 22 of FIG. 1, included the deployment of an optical modules 23 or 25 to receive (or transmit) the optical signal from terminals 12 or 16. These modules employ discrete, optically coupled optical active and passive components inside packages 23 and 25 and electronic linecards 21 and 24 for conversion of the optical information signal into the electrical domain, performing a 2R or 3R function, and then reconverting or regenerating the electrical domain signal back into the optical domain for continued propagation on the optical span 22. REGENS 20 may also have the capability of signal switching or routing to other networks or to local networks as indicated at 26. This OEO REGEN 20 was required between fiber spans 22B, 22C, 22D and 22E, which spans may typically be about 60 to 80 km in length, until the information signal reached its destination at terminal 16 (or terminal 14 depending on the direction of signal propagation) where the signal was converted into the electrical domain via optical module 16, comprising an optical detection element or component, such as p-i-n photodiode (PIN) or an avalanche photodiode (APD), and the signal was then further processed, such as amplified or reshaped, for example. As indicated, such an optical transport network 10 was generally bidirectional in that module 12 also included components of module 16 and visa versa in order that optical information signals can be sent and received in either direction along the fiber link 22. Such networks were capable of transporting a single optical signal, $\lambda_I$ and/or $\lambda_J$, e.g., at 2.5 Gb/sec or less, in either direction. However, to implement the network for signal transport, it was necessary to transport those signals respectively on a separate fiber, although there were systems that did utilize 1300 nm in one direction and 1500 nm in the other direction on the same fiber. Thus, there were bundles of fibers each supporting transport of a single modulated optical wavelength signal.

It is interesting to note that the concept of an OEO REGEN, such as illustrated at 20 in FIG. 1, goes back well before their first viable commercial utilization. Examples of types of OEO REGENs can be found in U.S. Pat. Nos. 4,090,067 (issued 1978), 4,688,260 (issued 1987) and 4,948,218 (issued 1990).

FIGS. 3A-3E explains pictorially the 3R function such as provided in OEO REGEN 20. First, a shown in FIG. 3A, clean digital pulses comprising an optical channel signal 11 is transmitted or launched on an optical link. Due to optical nonlinearities and impairments incurred in propagation of the channel signal over the link, which are explained in further detail below, the signal becomes so distorted and degraded, as seen at 13 in FIG. 3B, that OEO REGEN is necessary to restore the integrity of the signal; otherwise, the signal cannot be accurately read or deciphered at the optical receiver. The first step in the 3R process is re-amplification of the distorted signal 11 as shown at 15 in FIG. 3C. The next step, as shown in FIG. 3D, is to reshape the signal as a digital optical channel signal 17. Note, however, that signal pulse is still impaired as indicated at 19 where the pulse timing reference is incorrect. Thus, in the last step of the 3R process, the signal is retimed, as shown in FIG. 3E as regenerated replica of digital electrical signal 11, which is subsequently converted into an optical signal of like form via an optical modulator in an optical transmitter module.

The capacity of optical transport networks was increased by deploying time division multiplexing (TDM) where lower bit rate information signals are converted into higher bit rate signals for transport as a single optical wavelength. The lower bit rate optical signal is combined with other lower bit rate signals into a higher bit rate signal and transported all as a single wavelength over a single fiber to a receiving terminal or node where the low bit rate signals are separated out of the higher bit rate signal at the receiving terminal.

The capacity of optical signal transport was further materially increased with the advent of wavelength division multiplexing (WDM) commercialized in about 1994 where multiple optical information signals of different wavelengths were optically combined for transport as a multiplexed optical signal on a single fiber. This was a large leap forward because now multiple optical signals could be placed concurrently on a single optical fiber span or link.

Even though WDM brought a large enhancement to digital signal transport, the significantly high cost of OEO REGENS prevented immediate deployment due to the need to rejuvenate the multiplexed signal gain over short optical fiber spans, such as 40 to 60 km. This meant that the multiplexed channel signal had to be demultiplexed into the individual different-wavelength information signals which were converted into the electrical domain, possibly both reshaped and retimed and then regenerated back into the optical domain (OEO). Then, in about 1995, the commercial deployment of erbium doped fiber amplifiers (EDFAs) along the optical transport path became a reality. With advent of EDFAs, optically multiplexed signals could be simultaneously amplified in the optical domain (OO) and optical signal propagation distances were extended with the deployment of EDFAs along the span and between REGEN sites, i.e., the number of required REGEN sites along a given optical span and link could be reduced by providing OO conversion through the deployment of EDFAs in lieu of OEO conversion. Thus, the deployment of EDFAs eliminated the need for closer optical link spacing deploying costly OEO REGENs through the employment of intervening EDFAs 46, which is illustrated in FIG. 2. The advent of EDFAs enabled a new set of optical network economics due to the ability to replace multiple OEO REGENs at a single site with a single EDFA. However, the employment of EDFAs is not completely inexpensive because these fiber amplifiers must be of highest performance with operating characteristics such as good gain flattening characteristics and low noise figure over the operational bandwidth of the multiplexed optical signals. Also, these types of optical amplifiers limit the spectral extent of the optical signals that can be successfully amplified because of their limited gain bandwidth. The longer the network or system reach via optical amplifiers, the higher the cost of the network or system.

As shown in FIG. 2, in the EDFA implemented, bidirectional optical transport network 30, the point of signal generation may be, for example, from either optical terminal or node 32 or 36 having respective linecards 34 and 38. Also, along the transport path, OEO REGENs 40 are provided for 3R signal regeneration. At terminals 32 and 36, plural optical channel signals are generated from electrical pulse information signals and the multiple optical signals are multiplexed and launched onto an optical fiber span, such as span 41A or 41C. During signal propagation, the multiplexed signals are amplified by a high performance EDFAs 46 located along the optical span 41A, 41B or 41C. Initially, as an example, there may be about three to five such EDFA sites per span but, over time, the number in many cases could be increased to ten EDFA sites per span. When the multiplexed channel signals reached a REGEN 40, the multiplexed optical signals undergo demultiplexing followed by OE conversion, regeneration, reshaping and retiming (3R) via linecards 42 and 44 in the electrical domain and, then, EO conversion of the 3R generated signals performed in the transceiver modules 43 and 45 is accomplished for launching the optically rejuvenated or regenerated multiplexed channel signals on the next optical fiber span, such as span 41B. Also, these REGEN sites 40 include switching and routing capabilities at 46 so that channel signal can be switched, or routed or received from other nodes or sites for transmission from or into network 30. Multiplexed channel signals arriving at a terminal 32 or 36 undergo demultiplexing at 32A and 36A and OE conversion for electrical signal processing. Thus, each of the optical modules 32A and 36B has both OE and EO components so that optical signals can be transported in either direction of the optical span 41A, 41B and 41C.

The principal achievement of EDFA deployment, as indicated above, was the insertion of bidirectional EDFAs 46 along the optical link thereby eliminating the need for multiple REGENs and extending the length of the optical transmission up to about 100 km and longer before OEO REGEN becomes a real necessity. Thus, the optical spans 41A, 41B and 41C between OEO REGENs 40 could be extended by including optical amplification (OO) in either direction via EDFAs 46. This greatly enhanced the optical signal capacity.

In all of the different types of optical transport networks 30 having different channel capacity and/or different baud rate, the optical module and OEO REGEN architecture was principally the same, which is exemplified in FIG. 4 illustrating the types of discrete optical components that are found in typical optical modules terminals 32 and 36 and OEO REGENs 40. In some cases, the modulated sources comprise separate laser sources and modulator sources and in other cases, the modulated sources are integrated electro-optical modulator/lasers (EMLs). The case we show here is former case. Within each Tx module 50 and Rx module 60, a plurality of discrete optical components is utilized. While FIG. 4 shows Tx module 50 and Rx module 60 in separate packages, it is known to utilize both of these optical modules in the same package to form an optical transceiver or transponder. Each channel signal is EO generated or EO translated using individual optical components comprising a discrete channel laser and discrete channel modulator. However, the deployment of arrays of optical components is possible, e.g., a DFB laser bar of N laser emitters. But it is difficult to achieve multiple wavelength arrays of DFB lasers in a commercially practical manner because the wavelengths of the individual laser emitters must be of different wavelengths approximated or optimized to a standardized wavelength grid, such as the ITU grid, and their individual wavelengths stabilized against changing environmental and other operational conditions. For these reasons, the most reliable architecture to date is to deploy separate discrete tunable DFB laser components. These discrete optical components must be optically coupled to one another, which is highly expensive since such alignments, as identified at 51 and 61 in FIG. 4, must, in many cases, be carried out by hand for each of the optical coupling points.

Tx module 50 includes, for example, a plurality of discretely packaged DFB lasers 52(1) . . . 52(N-1) and 52(N)

which have a wavelength stabilization control to maintain their individual operational wavelengths optimized to a standardized wavelength grid. Each of the N DFB lasers 52 is optically coupled via a fiber to the input of a discretely packaged modulator 54(1) . . . 54(N-1) and 54(N), which is generally a Mach-Zehnder modulator (MZM). The outputs of each of the N MZMs 54 are then optically coupled via a fiber to the input of MUX 56. Currently, MUX 56 is, generally in most cases, are simple fiber combiners, thin film-based filters, fiber Bragg gratings, silica-based AWGs and silicon-based AWGs, although there are possibilities, such as optical circulators and polarization-based multiplexers. The output of MUX 56 is then optically coupled usually to some gain medium functioning as a preamplifier 58 to boost the multiplexed signals to higher amplitude due to insertion loss experienced in optical components 54 and 56 as well as optical loss experienced at optical coupling points 51 between these optical components (including optical coupling to DFB lasers 52). The preamplifier is generally a high performance EDFA. In general, today, the channel signals are transmitted with 50 GHz channel spacing.

In the configuration of FIG. 4, the multiplexed optical signal channels are launched on optical fiber link 57 which may include a plurality of EDFAs 59 spatially disposed along its length to amplify or provide gain to the multiplexed optical signals, as previously indicated in FIG. 2.

Rx module 60 generally includes a preamplifier 62, which is generally an EDFA. After pre-amplification, the received multiplexed signals are optically coupled via a fiber to the input of MUX 64, which, as mentioned previously relative to Tx module 50, is currently a silicon-based AWG. DEMUX 64 may also include additional filters to convert the 50 GHz channel spacing of the signals into 100 GHz channel spacing. The demultiplexed signals are then optically coupled via optical fibers to respective photodetectors 66(1) . . . 66(N-1) and 66(N) for conversion into the electrical domain. The photodetectors generally utilized are of the APD or PIN type. The linecard (not shown) then processes these converted signals. Again, there are a number of optical coupling points 61 where fiber connections must be made to optically couple plural optical components to one another.

WDM optical transport networks of the type shown in FIG. 2 began to evolve by first increasing the capacity, i.e., the number of signal channel wavelengths of the networks, which reduced the number of parallel networks, and, thus, optical regenerators required to support a traffic demand at a particular site.

Reference is made to FIG. 5 which exemplifies the progression of price or cost reduction in optical transport pricing with the advent WDM transport networks or systems with corresponding increase in channel capacity and drop in cost per channel between about the years of 1994 and 2002. As shown in FIG. 5, the first transport networks carrying a single wavelength in a single direction with 3R and OEO REGEN, illustrated in FIG. 1, were of high cost in 1994 as indicated at point 70 in FIG. 5. While the concepts and prototypes of WDM networks began to become a reality in 1994, they were not yet commercially practical until the advent of the optical fiber amplifier or EDFAs which significantly extended the network reach as well as capacity. The WDM transport networks were around 1996 with the advent of 2.5 Gb WDM systems at point 71. Between roughly 1995 and 1998 (i.e., between about points 71 and 72 of FIG. 5) and forward, 2.5 Gb WDM systems went from 8 channels to 16 channels to 80 channels. As the WDM systems grew in capacity, the cost of these systems and cost per channel steadily decreased as shown in FIG. 5. Between points 72 and 73 in FIG. 5 or roughly from 1997 and forward, 10 Gb systems came into operation further increasing capacity through increased data rates and correspondingly reducing the cost of the systems and the cost per channel. In this period of time, the 10 Gb systems went from 8 channels to 32 channels to 80 channels and eventually to 160 channels extending toward point 74 in FIG. 5. At about point 73 or around 2001, the concentration by vendors and service provider customers has been toward extending system reach through the deployment of more and more EDFAs along the optical spans as well as the deployment of counter-propagating Raman amplification, rendering the distance between OEO REGEN sites or nodes further and further apart, further reducing the cost per channel, but not at a rate of cost per channel as initially experienced in the past as seen between points 70 73 as compared to point 74 in FIG. 5.

While the capacity increases were effective in improving the cost-effectiveness of optical transport networks, the networks were able to improve their cost-effectiveness by a larger factor by increasing the network reach. The reach of the network was defined by the maximum distance that the optical fiber amplifier could continue to support an appropriate OSNR for the channel signals. Initially, the distances that service providers were attempting to reach between traffic locations ("routes") were typically much longer than the networks could support. Early networks were capable of reaching distances typically on the order of about 300-500 km. Routes today commonly reach distances exceeding 1000 km. Thus, multiple networks have to be concatenated together to reach other appropriate networks and terminations. Network costs were dominated by the electronic interfaces required at terminals 32, 36 and OEO REGEN sites 40 along long-haul routes. Thus, carrier providers were motivated to increase the reach of their networks to minimize the need for terminals 32, 36 and OEO REGENs 40. Over time, carrier providers were able to extend the reach of their optical transport networks to thousands of km.

The net effect over time on a typical route of 1000 km or any other extended system reach of a route even in excess of 1000 km, the increase of channel counts and distances has led to the following approximated economics savings relative to a normalized price:

TABLE 1

| Year | Approximated Economic Savings | Optical Network |
|---|---|---|
| 1994 | X | SONET OEO REGEN |
| 1996 | 0.340X | $1^{ST}$ Generation WDM |
| 1998 | 0.170X | $2^{ND}$ Generation WDM |
| 2000 | 0.057X | $3^{RD}$ Generation WDM |
| 2001 | 0.046X | $4^{TH}$ Generation WDM |

Said another way, the cost of optical signal transport has fallen by over a factor, for example, of over approximately 20 times in about the last seven years. However, along with these gains in deploying WDM systems in optical transport networks has come increasing complexity, together with additional costs, through the need for additional network components, higher performance and new constraints imposed by new and improved network devices, such as those for correcting nonlinearities and analog impairments. Continued increase in performance comes disproportionately with cost, which results in diminishing price/performance gains.

Thus, since network capacity has been largely addressed through these WDM transport systems carrying increasing larger number of signal channels, service providers now look to achieve economic gains by extending the reach of systems in their optical transport networks. This goal is based upon the premise that channel signal regeneration is costly and expensive. In order to achieve this goal, therefore, one solution is to eliminate OEO REGENS within the extended network reach. As result, there has been recent resurgence to provide an all optical transport network with OOO sites and OOO REGEN sites to eliminate costly OEO REGEN. This is because OEO REGENS are so much more expensive predominately because of the deployment of discrete optical components and their associated optical coupling point costs as well as 3R signal revamping in the electrical domain and subsequent signal regeneration in the optical domain via optical channel signal demultiplexing and multiplexing to perform full signal conditions. In this context, many companies and research facilities are working toward the development of an all-optical transport platform that is entirely in the optical domain, thereby eliminating any requirement for OEO conversion by its total elimination. A few examples of this work in this area are exemplified in U.S. Pat. No. 6,169,616 (OOO A/D), U.S. Pat. No. 6,335,819 (OOO REGEN), U.S. published patent application 2002/0015201 (OO spectrum attenuators) and U.S. published patent application 2002/0030867 (OO switching).

While the strides made toward an all-optical transport platform have been impressive, the ultimate achievement of a commercially viable all-optical transport platform is still many years away. Also, such OOO systems contemplate the continued deployment of many optical fiber amplifiers (EDFAs) between optical regen sites. This architecture has the continued analog drawback of wavelength dependent gain and noise as well as a variety of other non-linear impairments induced during the interrupted propagation down the fiber, causing unequal channel performance and, therefore, requires a multitude of added optical or opto-electronic devices and components to correct for their analog disparities such as gain flattening and dispersion compensation (DC). As an example, the above mentioned patent publication 2002/0015201 recognizes this problem and provides for signal attenuation for each channel to achieve equalized gain across the signal channel spectrum and likely lower OSNR but at the sacrifice of adding additional costly components to the system and still not eliminating accumulated channel signal imparities enhanced by cascaded analog optical fiber amplification in the transmission path.

Cost analysis of OEO REGEN, as known by those skilled in this area of technology, will reveal that these current packages utilized in the optical modules 50 and 60 a shown in FIG. 4 are the single highest manufacturing module cost in fabricating an optical transport network, with a leading cost factor in these modules being number of required optical fiber or other such coupling points 51 and 61. Multiplied by the number of such points 51 and 61, this is a major cost in the manufacture of optical modules for use in optical transport networks such as the network illustrated at 30 in FIG. 2.

What is needed as an alternative to the costly terminals an all optical network is an architectural approach to significantly reduce these high costs in optical module fabrication to provide a more palatable optical Tx or Rx module for terminals OEO REGEN for highly cost-conscience telecommunication service providers. Such new terminals and OEO REGEN sites need to be highly cost effective and a highly price competitive with both exiting OEO REGEN sites as well as OO sites such as the current deployment of EDFA sites along the optical fiber span.

As a review again in connection with the optical transport network 30 in FIG. 2, 1R signal treatment has been accomplished in the optical domain utilizing optical fiber amplifiers such as EDFAs and Raman amplifiers. To correct for signal attenuation, prior to any required OEO REGEN, EDFAs and Raman amplifiers have been deployed along the optical transport route toward extending the length or distance of digital signal propagation without significant signal impairment thereby significantly extending the distance required before providing any signal REGEN. To correct for optical signal impairments, such as GVD, signal impairment correction in the optical domain has been achieved through the employment of dispersion shifted fibers (DSFs) and optical dispersion compensating elements (DCE) toward further extending the length or distance of signal propagation without significant signal impairment thereby significantly extending the distance required before providing any signal OEO REGEN. In the case of the FIG. 2 architecture, in addition to the utilization of plural optical amplifiers (EDFAs or Raman amplifiers or other analog type amplification) EDFAs along the signal transport route to enhance signal gain, spectrum gain flatteners, VOAs and DCFs are employed to correct for signal nonlinearities and irregularities. However, in all these cases, complete signal REGEN in the true sense is not accomplished but rather signal amplification and some signal reshaping (2R) so that many analog-type signal impairments are still present and remain without such complete signal 3R OEO REGEN. What is needed is a cost effective way to provide OEO REGEN that replaces EDFAs and also provides for upgrade of optical amplifier sites to perform other functional capabilities such as signal routing or switching, multiplexing add/drop and grooming. By providing cost effective terminals and OEO REGEN sites in a new network, displacing existing OEO REGEN and optical fiber amplifier (OO) sites, the channel signal integrity is greatly enhanced, such as reduced BER reducing the requirement for more higher cost and more sophisticated FEC components and eliminating the need for optical signal conditioning components such as VOAs, gain flattening filters, DCF, etc., to name a few, and time extend for the replacement of existing transport fiber with newer higher performance optical fiber.

Thus, said another and possibly a more simplified way, digital optical network relative to this disclosure means complete digital signal REGEN in a highly cost effective and competitive manner to replace both existing REGEN sites and OO (EDFA) analog sites in both current and future optical transport networks.

OBJECTS OF THE INVENTION

It is an object of the present invention to provide a new optical transport network architecture that provides for a highly cost-effective Tx and Rx modules or Tx/Rx modules.

It is a further object of this invention transforming conventional analog optical networks into digital optical networks.

It is another object of this invention to provide a Tx and Rx or Tx/Rx modules that includes a photonic integrated circuit (PIC) to provide a more compact optical Tx and Rx module replacing racks of equipment space presently needed with conventional optical modules deploying optically coupled discrete optical components.

It is another object of this invention to replace EDFAs and OADMs with an ultra low cost, competitively priced 3R digital optical network (DON) utilizing integrated circuit optics in place of discrete optical devices presently deployed in optical transport networks.

It is a further object to provide a digital optical network (DON) that is easily upgradable or scalable.

SUMMARY OF THE INVENTION

According to this invention, a digital optical network (DON) is a new approach to low-cost, more compact optical transmitter modules and optical receiver modules for deployment in optical transport networks (OTNs). One important aspect of a digital optical network is the incorporation in these modules of transmitter photonic integrated circuit (TxPIC) chips and receiver photonic integrated circuit (TxPIC) chips in lieu of discrete modulated sources and detector sources with discrete multiplexers or demultiplexers.

A "digital optical network", as used herein, may be defined in several but independently different ways. First, it is a network that minimizes the need for optical components that correct for optical analog impairments that arise in the transmission of the signal. These optical analog impairments are defined as any degradation in the quality of the transmission signal that occur during the optical propagation of the signal, either in the fiber, or through any components between the EO or OE conversion of the signal. These analog impairments include, but are not limited to: chromatic dispersion, polarization mode dispersion, gain or loss variation among channels, four-wave mixing, stimulated Raman scattering, cross and self-phase modulation, and intersymbol interference. Examples of optical components that correct these analog impairments are such as, but not limited to, optical fiber amplifiers, gain-flattening filters, variable optical attenuators, and DCE (including tunable dispersion compensators, DCF and polarization controllers, and dispersion compensation trimming techniques). Said another way, a DON is a network that eliminates the need for or otherwise substantially minimizes the content of optical components that correcting optical analog impairments. Second, the network of this invention enables the average spacing or spatial separation between OEO REGENS is less than that of current networks for DWDM systems, enabled by the utilization of effective low cost OE and EO signal conversion. Third, the network of this invention enables the average spacing or spatial separation between OEO REGENS is less than that of current networks for DWDM systems, enabled by the utilization of photonic integrated circuitry or PIC chips. Fourth, the network of this invention provides for a substantial reduction in fiber coupling in terminals and other sites or nodes for equivalent capacity (measured in Gb/s) and the number of channels. Fifth, the network of this invention provides for substantial reduction in fiber coupling throughout the network for equivalent capacity (measured in Gs/s) and the number of channels. Sixth, the network of this invention provides for a substantial reduction in the number of optical amplifiers needed or required in a network. This is, in part, due to the utilization of low cost OEO (which in a preferred embodiment is TxPICs and RxPICs). Seventh, the network of this invention enables the utility of 100 Gbits transmission capacity and more on a single system board through the incorporation of PICs enabled with high speed electronics. Eighth, the network of this invention enables higher density transmitter, receiver, or transceiver modules through the employment of TxPICs and RxPICs. Ninth, the network of this invention provides for largely constant dollar value per unit span length. DON is substantially linear in cost with optical span or link distance which is not true in analog optical networks. Cost per km can be measured by total cost of the network divided by the number of nodes (terminals). DON increases the number of nodes while reducing the cost of the network. Tenth, the network of this invention has the capability of providing a TxPIC and RxPIC module that includes additional signal channels on the PICs that are not placed in operation until requested by the carrier provider because of either new and continuous signal traffic at an installed site or due to a temporary increase in signal traffic which only exists during certain times or periods of time. In this manner the carrier or service provider only pays a fee to the equipment provider for capacity used at an installed site at any particular time relative to the number of PIC signal channels temporarily placed in use.

A DON may also be defined as a WDM system with closer spaced OEO REGENs (or a higher number of them placed in the network) than in a conventional system that allows higher launch powers or smaller channel spacings, the higher frequency of OEO REGENs enabled by low cost OEO as described above. As described previously, the reduced distance between REGENs in a DON means that there is less distance that non-linear impairments may accumulate over an undesirable amount before being corrected. This facilities the advantageous characteristics of smaller channel spacing or higher launch powers.

A another embodiment of a digital optical network, as defined herein, is one that utilizes: (i) low-cost PIC transmit or receive module(s) for the transmission interfaces in the system (at terminals or REGENs), (ii) a highly integrated signal processing chip or chips, and (iii) low-cost PIC module(s) for tributary interfaces. This DON terminal can be described as an ultimate terminal architecture in that it has a minimum number of optical-electronic and electronic components and hence has advantages of lower cost with higher density. The minimum cost is realized by virtue of the minimum number of components which reduces the cost total component cost. Furthermore, the manufacturing cost of the system is reduced since the number of components is reduced, reducing the complexity of the manufacturing process. Without the improved density of these modules, the integrated electronic processing chip(s) are of significantly diminished value or may not even be feasible in a system. The density of the PICs translates into the decreased distance that high-speed signals must be routed on a board before they reach the intended integrated electronic processing chip(s). Without TxPIC or RxPIC chips, channel signals at the line rate of the system must be routed over significant distances on the board, resulting in substantial degradation of the signal and increased cost and complexity of the board itself. Thus, the PIC modules enable the utilization of low cost integrated electronic processing chips in a digital optical network.

As used herein, a TxPIC chip, in its simplest form, is a monolithic semiconductor chip having an integrated array of multiple different wavelength, directly modulated sources or an integrated array of multiple different wavelength sources coupled to an integrated array of modulators, both of which are referred to herein as modulated sources, coupled to a multiplexer or combiner where the coupling may be accomplished by monolithic integration, butt-coupling, free space coupling with adjoining optics or fiber coupling wherein the number of fiber couplings to components is substantially reduced over that of the deployment of discrete packaged components as illustrated in FIG. 4. The wavelength sources may, for example, be DBR lasers, DFB lasers, or tunable DFB or DBR lasers. The modulators may, for example, be any type of electro-optic modulators including electro-absorption modulators (EAMs) or Mach-Zehnder modulators (MZMs). The multiplexer may, for example, be a star coupler, a MMI coupler, an Echelle grating coupler or an arrayed waveguide grating (AWG). A RxPIC chip, in its simplest form, is a monolithic semiconductor chip having an integrated array of multiple photodetectors, optically coupled to an integrated demultiplexer or decombiner where the coupling may be accomplished by monolithic integration, butt-coupling, free space coupling with adjoining optics or fiber coupling wherein the number of fiber couplings to components is substantially reduced over that of the deployment of discrete packaged components as illustrated in FIG. 4. The photodetectors may, for example, be PIN photodiodes, avalanche photodiodes (APDs), metal-(MSMs) photodetectors, or velocity-matched distributed photodetectors (VMDPs). The multiplexer may, for example, be a star coupler, a MMI coupler, an Echelle grating coupler or an arrayed waveguide grating (AWG). In the illustrative embodiments in this application, an integrated from of the TxPIC and RxPIC are shown as well as butt-coupled illustrations. However, with respect to a digital optical network, it should be understood that free space or fiber coupling may also be deployed to some degree.

A further feature of this invention is an optical digital transport network (DON) provides an ultra low-cost, digital, optical-electrical-optical (OEO) channel signal regenerator (REGEN), as distinguished from an analog network delaying analog optical components such as optical fiber amplifiers, comprises semiconductor photonic integrated circuit (PIC) chips where all the active and passive optical components, except possibly additional off-chip amplification, are integrated onto the semiconductor chip deploying the forms of TxPIC and RXPIC chips as just described above, together with any associated electronic circuitry to perform 2R, 3R or 4R signal regeneration and any necessary cross-connect. The TxPIC and RxPIC optical module architectural approach solves the bottleneck created by the rising cost concerns of telecommunication service providers in the continued employment of conventional OEO REGEN with optical amplifiers in optical transport networks which has been, to some extent, ameliorated by deployment of such intervening OO analog sites in the optical transport path which do not perform 2R, 3R or 4R functionality. This new approach is premised on the basis that digital OEO REGEN can be accomplished in a very cost-effective and competitive manner, not requiring a gravitation from or substitution of OEO REGEN sites or nodes to or by OOO REGEN sites or nodes. This has a two fold impact on solutions: First, if OEO REGEN can be implemented more cost-effectively, then a resultant system architecture that is based on regeneration ubiquitously can be more cost effective than existing solutions at all network reach distances and any capacity. By operating in the electrical domain at every OEO REGEN site, the optical transport network no longer needs to be designed to the high performance specifications that were required by extended reach systems. For instance, the use of OEO regeneration, more frequently than typical optical repeater systems, reduces accumulation of nonlinear or analog impairments. This enables higher launch powers or higher channel density in a DON compared to typical OO repeater systems, such as those employing high performance EDFAs. This is because these impairments are not accumulated or present and, therefore, such a threat as they would upon increasing the launch power from the digital OEO REGEN. Second, by operating in the electrical domain enables the optical transport network to be designed with more modularity to provide for later capacity increase including at existing optical fiber amplifier sites, particularly since optical fiber amplifier sites dominate the initial cost of optical transport network deployment. Said another way, the deployment of photonic integrated circuit (PIC) chips with IC chips in the electrical domain operation enables network costs to grow incrementally as a function of needed capacity to meet the requirements of new signal traffic demands. Third, optical network costs can be optimized independently of span or link length scale. Fourth, no electronic equalization is generally required as in the case of analog systems where nonlinearities of the optical transport require gain equalization at some point which can be handled optically but eventually has to be done electronically to achieve full equalization.

To be noted is that we referred to our new architecture approach as a "digital optical network" as differentiated from analog optical networks deploying analog type optical components, such as EDFAs, which provide various analog type of optical analog impairments (such as, OSNR with added noise figure (NF), GVD, distorted signal shape, signal pulse stream dislocations due to distorted timing, PMD, unequal gain across the signal spectrum or gain tilt) despite the important principal function they performed (signal gain). It is noted that the term, "digital optical network", has, in the past in a few patents to refer to optical transport networks using SONET or and the promulgated communication protocols used in such networks. In this sense, this terminology is referencing, in part, digital signal transmission as opposed, for example, to analog signal transmission, such as deployed in the past for electrical signal transmission systems. In the present application, reference to "digital optical network", or DON, can also be one that as one that does not utilize expensive, network added, optical correcting components to compensate for analog kinds of signal impairments such as providing dynamic gain flattening, tunable dispersion compensation, slope-trimming dispersion compensation modules and PMD compensation. Said another way, the DON approach is not constrained by analog network limitations.

As previously indicated, the basic building block of the digital optical network is the photonic integrated circuit (PIC) for both the optical transmitter and the optical receiver. This device facilitates the incorporation of multiple EO or OE components for handling a plurality of WDM channels on a semiconductor PIC chip. The increased number of components on the chip drastically reduces the number of packages required in an optical network module and, thus, radically reduces the cost structure of the network since these modules with their discrete devices and optical fiber coupling are the major contribution of the cost in optical network gear.

The ultra low-cost OEO REGENs in a digital optical network allow the addition of low cost 2R or 3R or future 4R regenerators throughout the network. These low-cost regenerators are competitive in cost with optical amplifiers (ED-FAs, Raman amplifiers, SOAs, etc.) and hence are a suitable replacement for these devices in an optical transport network. Thus, a digital optical network comprising this invention may contain more OEO REGEN sites or terminal sites in an optical transport network than compared to a conventional network of the type, for example, shown in FIG. 2. These sites may replace some or all of the optical amplifier sites of the conventional network.

Furthermore, the presence of OEO REGEN sites of this invention in the network results in a reduction of the total distance that optical information signal must travel in the network before experiencing regeneration. Because of the effective low cost of OEO REGEN sites in the network, the number of expensive bidirectional EDFAs deployed may be drastically reduced. Where EDFAs are desired to be utilized in the network, less expensive EDFAs with substantially reduced specifications, i.e., reduced performance characteristics (e.g., high performance requirements of gain flatness, gain, saturated output power, decreased transient response capabilities, etc.) may be utilized. Such EDFAs have substantially lower costs than conventional EDFAs employed in present day networks by fabricating the amplifier with decreased transient control response. Consequently, the cost of the hybrid digital optical network is further reduced by employing such amplifier devices. Since high-cost conventional EDFAs are not required in the digital optical network of this invention, the first-in cost of the optical transport network is greatly reduced. The first-in cost of a network is the initial cost for a system or provided with all available signal channels which reduces this cost.

The increased presence of low cost OEO REGENs utilized in this invention in an optical transport network provides in increased performance monitoring capability, flexibility and scalability at each terminal and regeneration site, namely the cost-effective, ease and ability to add/drop, switch, route, or groom channels at the digital OEO REGEN site. In conventional networks employing many EDFAs, the only way to best determine BER of the transmitted signal is to monitor OSNR. However, in an OEO REGEN site, the BER can be directly measured as well as the examination of a variety of other SONET performance monitor criteria built into SONET protocol. At these OEO REGEN sites, the signal is accessible in the electrical domain, allowing the aforementioned functionality to be performed at low cost employing fairly conventional electronic circuitry and allows in-network detection and local isolation of errors. Thus, additional functionality, flexibility, and scalability are facilitated in the digital optical network. Such functionality is very valuable to carrier service providers. For example, the digital optical network allows a carrier to adapt and optimize their network for variable traffic demands and increases drastically the number of sites that can add/drop channels thereby minimizing or eliminating the backhauling of traffic in an optical transport network, all which provides for more servicing of customers. Furthermore, the ability to switch, route, and groom in the electrical domain allows the construction of network architectures that are not currently economically feasible with present conventional networks such as, for example, add/drop sites.

The transmission channels that are deployed in a digital optical network are deployed with at least a minimum number of signal channels. This minimum is dictated by the minimum number of channels on each TxPIC and RxPIC employed in a digital optical network. Each digital optical network terminal or REGEN may consist of multiple TxPICs and/or Rx PICs that are multiplexed/demultiplexed together to form the total transmission or regeneration capacity at a network site. The number of channels on a TxPIC chip or RxPIC chip is a function of a number of factors, including, but not limited to, the cost of the PIC chip, the cost of the packaged PIC chip, the number of channels that can be accommodated on a submodule board, the architecture of the optical link, and the granularity of channels that a customer wishes to add to the network over time. Typical channel counts that may be integrated in a TxPIC or RxPIC may range over 40 channels and is significantly multiplied by the combination or plurality of such PIC chips in an optical transceiver module to hundreds of channels.

With respect to performance monitoring, the digital optical network of this invention provides for a first time increased accessibility to more points along an optical transport network than previously before in providing the ability to verify the BER on any channel at any point on the span where there was, for example, an installed optical amplifier, or other placement of a DON digital OEO REGEN. Long haul systems maintain the signal in the optical domain for 600 to 3200 km and, hence, pinpointing any degradation in signal quality is extremely difficult and has been a severe limitation in gaining acceptable of long haul optical systems. The ability afforded by a DON digital OEO REGEN or DON network site to verify the error rate on any channel at the end of every span or every few spans is a tremendous advantage in network management and isolating error rate and other transmission problems.

The deployment of a digital optical network (DON) according to this invention provides a unique business model. The ability of the digital optical network to provide additional transport capacity or network functionality at very low-cost results in an opportunity to establish a unique business model for a digital optical network. Such a business model comprises selling the minimum functionality that the customer requires in an optical transport network but includes additional channel and signal processing functionality in network hardware and software. The ability to sell such additional functionality is enabled by the ultra low-cost nature of a digital optical network. A customer, such as a carrier service provider, will typically not initially require all of the capacity or functionality that a digital optical network having multiple on-chip wavelength signal channels can provide. Thus, the digital optical network will typically be configured to provide for adding additional hardware to meet future demands of the service provider. However, as indicated above, a deployment of the digital optical network, either for purposes of establishing a new network or upgrading of an existing network, may be designed to already include more hardware and software functionality than the customer immediately requires. This can be accomplished because the initial manufacturing costs for TxPIC or RxPIC chips with more channel capacity than initially required is not a significant cost increase in the manufacture of such semiconductor PIC chips. This is enabled by the unique cost effective nature of multi-channel PIC chips deployed in a digital optical network. For example, a customer may require only a few optical data channels to be transported on the WDM digital optical network, wherein the PICs chips provide a larger channel capacity to transport 10 or 20 or more channels. The customer does not require at the point of installation in its optical transport network the additional capacity already provided by the packaged PIC chip modules so that all of the channels need not be initially activated or placed into operation. In this manner, additional inactive channels already in a carrier service providers equipment not in use can be activated during peak signal traffic times such as through a lease arrangement where inactive signal channels are activated in accordance with traffic demands and signal channels are deactivated as traffic demands become less. As a result, the provider only pays for given signal channels in operation during leased periods of time, such as leasing on a per month basis. This approach provides the carrier provider with the minimal costs for operating leased equipment plus provides for a direct tax right-off benefit versus equipment depreciation. This is also a cost-effective solution for later channel capacity upgrade because, as previously indicated, the manufacture of TxPIC and RxPIC chips with additional, integrated channel capacity is not that additionally expensive. Similarly, the customer may not initially require at the installation site, add/drop, switching, routing, or grooming capabilities that a digital optical network could so provide. These capabilities can be provided later at a site via low cost expansion of services utilizing the digital optical network. These additional capabilities are readily added because the channel signals are already in the electrical domain.

Also, additional hardware and software may be included with the initial network installation and is not enabled at the time of deployment. However, the network hardware and software is enabled for the customer at a later date by either hardware and/or software upgrades. These upgrades in system capacity, for example, may be enabled by keys, pass codes or passwords, for example. In such a business model, the deployment with the additional but non-deployed capacity or functionality may be sold at a reduced price in the initial sale and installation of the network. Later enablement of the latent capacity and/or functionality of the digital optical network is accomplished by upgrading the previously installed network by permitting the customer accessibility to the additional, existing but inactivated, capacity or functionality with the vendor of the digital optical network enabled to recoup pricing discounted in the initial sale and network deployment of the digital optical network.

The operation of a business utilizing the business model, just described, is advantageous for a number of reasons. First, matching the customer required capacity and the number of channels that are added in a given digital optical network deployment is highly unlikely. This is especially true when considering the functionality planned or installed at different sites or nodes. The business model allows the vendor of the digital optical network to realize profits from the additional functionality that is not initially required by the customer. Second, the business model allows the vendor of the digital optical network to compete favorably with competitors that have an existing network installed in the customer's fiber plant. In such a situation, the competitor will sell incremental capacity to the customer. The vendor of the digital optical network, who will typically be required to initially implement not only channels but the common transmission equipment, can then market its product to be competitive with the competitor's conventional solution which has a finer granularity of deployment, i.e., discrete channel build for present customer requirements, but at a much higher cost per channel compared to the case of a digital optical network. The lost margin on the digital optical network can be fully or partially recovered by enabling additional channels or functionality in the network as the customer requires such channel capacity in the future. (Note that the loss of a transponder or transceiver by the service provider because of replacement for higher capacity system is a high cost component relative to adding additional PIC-based channels to an existing PIC module site.) Third, once the digital optical network is deployed, the business model makes it difficult for upgrade entry by a competitor. Such competitors will need to deploy additional hardware and software whereas the aforementioned business model will only require additional software and possibly some minimal hardware, the major hardware being already in place via the initial installation. Thus, the cost of additional capacity and/or functionality in a digital optical network will be much less than compared to a competitor and can be priced to ensure that future business is captured by the already installed, but not yet enabled, digital optical network hardware. Fourth and last, the time, resources, operational cost, and risk of deployment errors is greatly reduced since the additional hardware and software that is yet to be enabled in a digital optical network is already in place. Customers, such as carrier service providers, will see this as a distinct advantage of the digital optical network and will potentially pay a premium for the latent capability of the network or will prefer to enable the latent capability over adding new hardware and software from another source.

Reference is again made to FIG. 5 illustrating in a graphical representation the decline of optical transport pricing (costs) over a 100 km route. As seen by line 75, the cost effectiveness of the digital optical network in accordance with this invention will take a significant downward deviation due to, in a substantial manner, the reduction of cost in the manufacture of a TxPIC chip and a RxPIC chip that are completely in monolithic chip form which are all necessary components for signal light generation, signal modulation and signal combining and/or signal de-combining and detection provided as photonic integrated circuits (PICs) on a semiconductor-based chip, in particular a InP substrate based chip. The TxPIC and RxPIC may be formed on a single PIC chip or formed as separate PIC chips.

Thus, relative to forgoing, other features of this invention are the replacement of analog optical network sites, such as EDFA sites, with digital optical network sites with optical TxPIC and RxPIC chip modules of this invention. Reference in this connection is made to FIGS. 6A-6D which is a simple view of the progression of what has happened over the last several years relative to optical transport systems or networks, which is, to some extent, a summary of the previous discussion relative to FIGS. 1 and 2. Thus, as shown in FIG. 6A, optical transport networks initially started as a single signal which was regenerated at OEO REGEN sites 80 positioned at about 80 km distances along the optical span. The network architecture was a series of expensive OEO REGEN sites in the optical span. Then came the advent of WDM systems as shown in FIG. 6B and the inclusion of approximately three to five EDFAs 82 along the optical span, the distance between expensive OEO REGEN sites 80 could be extended. This extension has grown further, as indicated in FIG. 6C, with approximately ten or more optical amplifiers 82 provided along the length of the optical span prior to OEO REGEN at 80. As previously indicated, the trend is to extend this span distance to even greater distances before any required signal regeneration as well as developing systems to do signal regeneration all or mostly all in the optical domain toward eliminating any extensive use of OEO REGENS. However, as taught in this invention, this trend is not necessary or even desirable since cost effective and competitive digital OEO REGEN sites 84, as shown in FIG. 6D, can be provided at least 10 times less than the cost of OEO REGEN sites 80 previously deployed. In this way, the digital OEO REGEN sites 84 have come full circle relative to the advent of EDFA boosted WDM systems.

The architectural approaches of this invention provides for greater flexibility, at both OEO REGEN sites and OO sites in upgrading them to provide added functionality dependent on local capacity requirements such as providing new or additional, 3R or 4R functionality, or add/drops, switching, routing, grooming, thereby also reducing any backhauling requirements.

Another feature of this invention is the elimination of some, if not all, analog optic components with the deployment of a digital optical network of this invention including the elimination for the need or requirement of dispersion compensation (DC) compensators, PMD compensators, gain flattening filters and equalizers, VOAs, optical switches and OADMs, broad range tunable semiconductor lasers, complex OOO REGENs and other band (S or L band) optical amplifiers. Such optical components are illustrated, in part, in U.S. patent application publication No. 20002/0044722A1 (OADM); U.S. Pat. No. 6,363,183B1 (OADM); U.S. Pat. No. 6,169,616B1 (OADM); U.S. Pat. No. 5,385,364B1 (optical switch); U.S. Pat. No. 6,335,819B1 (OOO REGEN system); U.S. patent application publication No. 2001/0053008A1 (all-optical regeneration); U.S. patent application publication No. 2002/0015201A1 (network channel propagation extension with EDFAs deployed with VOAs).

Another feature of this invention is the ease of added granularity in wavelength or channel scaling to provide for any incremental increase in channel capacity between any two REGEN sites through the modularity capability of the PICs brought about by this invention.

Another feature of the architecture of this invention is the elimination of the requirement for expensive discrete, tunable DFB lasers and all-optical switching.

Another feature of this invention is the significant elimination in the number of fiber connections required in an optical transmitter, receiver or transponder so that efficiency and optical insertion loss can be greatly improved and fabrication labor and costs can be greatly reduced such as the time required and costs associated with alignment of discrete active and passive optical components as illustrated in connection with FIG. 4.

A further advantage of the architecture of this invention is the elimination of the requirement, if desired, of on-chip or off-chip amplification via EDFAs which are bandwidth limited as well as SOAs in certain situations but, in any case, significantly increase the power budget of the PIC chip. Rather, the present invention permits usage of the full bandwidth IR range of optical fibers, such as, for example, from about 1250 nm to about 1650 nm through the deployment of the digital OEO signal REGEN.

Another feature is that with the deployment of low-cost, digital OEO REGEN sites of this invention, the identification, isolation and location of faults in the network becomes easier since the span length between the REGENS can now be cost effectively smaller. This correlates with the fact that with the deployment of such digital OEO REGEN sites, the network will naturally have more locations where performance monitoring of the channel signals in the electrical domain is now possible.

Still further feature of this invention is the enhanced ability to easily upgrade the capacity of digital REGEN sites by simply adding additional RxPICs and TxPICs interleaved with existing RxPICs and TxPICs already deployed at the REGEN site to incrementally add channel capacity between any digital optical network REGEN sites.

A still another feature of this invention is a business model of providing a digital optical network deploying additional network capacity and functionality for future use through the semiconductor chip nature of including additional signal channels on TxPIC and RxPIC chips that may be deployed at a later time at the optical transport network installation site.

Still a further feature of this invention is the provision of a digital optical network that eliminates the need for dispersion compensation (DC), PMD compensation, gain flattening filters and gain equalization, optical switches and OADMs, discrete tunable laser sources, and other high performance band analog amplifiers, such as L-band fiber amplifiers.

Lastly, it is simple physics to understand that it is much more difficult to "push around" or handle photons as compared to electrons, such as in optical switching or cross-connects. The reason is that photons have higher momentum than electrons and, therefore, take more energy to handle them or take care of them. Therefore, it is always easier to deal with electrons over photons particularly relative to functions that a great deal of energy to process propagating light as in optical switching.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 1 is a schematic view of a first optical transport network as known in the art.

FIG. 2 is a schematic view of a second optical transport network as known in the art.

FIGS. 3A-3E are graphic illustrations of the effects of nonlinearities and other optical impairments on a transmitted optical channel signal as is known in the art.

FIG. 4 is a schematic view of the details of an optical Tx module and an optical Rx module deployed in the network shown in FIG. 2.

FIG. 5 is a graphic illustration of the variance in costs per signal channel of various deployed optical transport networks over time.

FIGS. 6A-6D is a schematic illustration of the deployment of optical transport networks over approximately the last ten years and how, with the architecture disclosed herein, the network ends up looking like the original optical transport network but at much reduced manufacturing costs, much higher capacity, higher density equipment space, and greater optical integration.

FIG. 7 is a schematic illustration of the optical transport network of this invention.

FIG. 8 is a schematic illustration of a 3R junction (switching) site utilizing this invention.

FIG. 9 is a schematic illustration of a 3R A/D site utilizing this invention.

FIG. 10 is a schematic illustration of a metro ring network utilizing this invention.

FIG. 11 is a schematic illustration of a regional ring network utilizing this invention.

FIG. 12 is a schematic illustration of a TxPIC chip utilized in the architecture and practice of the architecture of this invention.

FIG. 13 is a schematic layout of the TxPIC chip of FIG. 13.

FIG. 14 is a schematic illustration of a RxPIC chip utilized in the architecture and practice of the architecture of this invention.

FIGS. 15A-15G are a series of illustrations showing different alternative configurations for the TxPIC and RxPIC utilized in the architecture and practice of this invention.

FIG. 16 is a schematic illustration of a 3R OEO REGEN utilized in the architecture and practice of this invention.

FIG. 16A is a schematic illustration of digital 3R REGEN sites deployed along an optical span.

FIG. 17 is a schematic illustration of an OEO REGEN, capable of A/D, switch/route, multiplexing and signal grooming utilized in the architecture and practice of this invention.

FIG. 18 is a more detailed illustrative example of the features pertaining to the architecture of the digital optical network of this invention.

FIG. 19 is a schematic illustration of an alternative version of the optical transport network shown in FIG. 7.

FIG. 20 is another embodiment of architecture of the digital optical network of this invention utilizing multiple TxPIC and RxPIC chips.

FIG. 21 is a further embodiment of the digital optical network of this invention at a network terminal.

FIG. 22 is further embodiment of the digital optical network of this invention at a network OEO REGEN site.

DETAILED DESCRIPTION OF THE INVENTION

Reference is now made to FIG. 7 showing a digital optical network (DON) 100 comprising this invention. Shown in FIG. 7 is a long haul fiber span with terminals 102 on either side of the span and a plurality of digital WDM (OEO) 3R REGENs 104 provided along the span. REGENs 104 are shown in FIG. 16 and have optical transmitter and receiver PIC chip structures of the type shown in FIGS. 12-14 which are to be discussed later. It should be realized that other configurations, other than those illustrated in FIG. 12-14, may be utilized in the architecture of this invention, which other configurations are illustrated in FIG. 15a-15G herein as well as in the patent applications incorporated herein by reference. In this connection, reference is also made to these incorporated patent applications which discuss in more detail, the layout, fabrication and operation of TxPICs and RxPICs. In the illustration of FIG. 16, the RxPIC/TxPIC chips are back-to-back to provide for OEO functionality with associated electronic circuitry. As seen in FIG. 16, each digital REGEN 104 is bidirectional and includes, in each direction, i.e., is East and West, at least one RxPIC chip 140 and at least one TxPIC chip 120. The multiplexed optical information signals, propagating from West to East or from East to West, are received on optical link 139 or 141 and coupled into RxPIC 140 where they are demultiplexed and converted into electrical signals. These converted signals are taken off-chip at lines 137 and are 3R processed at electronic circuit 172 and provided to electrical cross connect 174 where they are passed through or re-routed and passed through cross connect 174 to electronic circuits 176 were they may be 1R processed and provided respectively to TxPIC 120 for conversion back into the optical domain and launched on fiber link 139 or 141. 3R REGEN 104 is comparatively small relative current OEO systems since much of the optical circuitry is integrated on semiconductor type of chips.

It should be noted that TxPIC chip 120 and RxPIC chip 140 may be independently deployed without the other in terminal sites, such as initial transmission of optically modulated signal channels from a source origin with TxPIC chip 120 or end reception of optically multiplexed signal channels at a receiver terminal with RxPIC 140.

FIG. 16A is an illustration of an optical span with a plurality of digital OEO REGEN sites 104, one of which is shown in FIG. 7. Digital OEO REGENs 104 are deployed along an optical span at points where propagating channel signals minimally require 1R regeneration but, instead, provide 3R regeneration. REGEN sites 104 can be deployed at points where optical fiber amplifiers, e.g., EDFAs, were previously deployed or are desired to be deployed to re-amplify the propagating channel signals, or can be deployed at digital linear add/drop sites and junction sites as depicted in FIG. 18, to be discussed later. As an example, REGENS 104 are price-competitive with EDFA sites and, in addition, minimally provide the capability of signal re-amplification, re-shaping and retiming, the latter of which are not capable of being accomplished by an EDFA.

In addition to a pass-through OEO REGEN sites 104, the digital optical network can also be deployed as a 3R junction site 106 as illustrated in FIG. 8 or as a 3R A/D site 114 as illustrated in FIG. 9 to such existing sites or, more importantly, as an upgrade to an existing digital OEO REGEN site 104 to add switching or A/D functionality. In this manner, DON is modular in that it can be upgraded to include additional functionality eliminating the need for analog span engineering as is necessary in conventional optical analog systems and sites. As shown in FIG. 8, the junction site 106 includes a set of three OEO REGENs 108 with appropriate line card circuits 110, each similar to the structure of REGEN 104 shown in FIG. 16, and a electrical cross connect 112 for electronically switching the OE converted signals to one of the three appropriate outputs through electronic matrix switching and the signals are EO converted via REGEN 108 and launched onto a fiber link.

In the A/D site 114 in FIG. 9, the OE converted signals at REGENs 108 may be routed to a different optical transport network or network element (NE) 118, which, for example, may be a switch or cross connect. The advantage of the DON architecture of this invention is the provision of a full flexible A/D multiplexer replacing any optical fiber amplifier site at a competitive price with such amplifiers. Moreover, an already installed digital 3R OEO REGEN site 104 can be conveniently upgraded to a digital A/D site 114 to provide any configuration of selective channel add and drop.

FIG. 10 illustrates in simplistic form, a metro network comprising fiber ring 103 with plural digital DON terminals 102. In a conventional metro network, these terminals are analog and engineered to provide for designed traffic requirements. If traffic patterns change, as indicated by dotted lines 105 where traffic demands have changed to direct more channel traffic to the East terminal 102, the East analog terminal must be redesigned and changed to meet the changing traffic needs and increase its capacity. Said another way, such conventional terminals with their discrete channel components are not forecast tolerant. Future traffic demand or changes in traffic patterns are not predictable. So, to meet new or changing traffic demands, the conventional site must be redesigned or re-engineered substantially from the beginning to include additional channels and additional optical channel add/drops to replace or bypass the existing site or node. Each such additional add/drops means additional dB insertion loss. This limits the capacity of network ring 103. Adding additional EDFA sites to metro ring will help increase traffic capacity but this is an expensive approach. However, the deployment of digital terminal sites 102 in accordance with the architecture of this invention eliminates these problems by deploying digital REGEN terminal sites 102 on metro ring 103. In particular, the digital 3R REGEN sites 102 provide flexibility in functionality choices modularity or scalability in increasing channel service capacity without requiring redesign engineering at the site. This is because the modularity capability of adding additional signal channels through the addition of TxPIC/RxPIC chips to the system board. Added functionality can be provided, such as, A/D multiplexing, switching, routing and grooming through the added or replaced circuitry to include the additional function at the site directly to the existing digital 3R OEO REGEN site components. This modularity provides for a "pay as you go" system and eliminates the costly expense of reengineering, from the beginning, a conventional analog site to meet new capacity and/or upgrade in functionality. Also, in metro networks which include EDFA amplification sites cannot be upgraded without replacement of the existing analog OEO regeneration site. The placement of existing and future EDFA sites with digital REGEN sites of this invention permits future upgrade in functionality at those sites without later replacement of existing equipment at the site. This added modularity and upgrade capability is an important feature provided by the digital optical network of this invention.

FIG. 11 is a simplistic form of a regional network which is principally the same as the metro network in FIG. 10 except has a larger distance and capacity ring 107 and the network communication is more mesh-like in nature. As in the case of the metro network of FIG. 10, the regional network employing 3R OEO REGEN sites 102 provides more flexibility in system revamping or upgrading at comparatively much lower costs due to the deployment of transmitter and receiver photonic integrated circuit chips for channel signal reception and regeneration in the optical domain and 3R signal regeneration (re-amplifying, reshaping and retiming) via linecard chip set circuitry in the electrical domain. The upgrade in channel capacity is accomplished by adding additional PIC chip modules to increase the capacity of the network through an increase of the number of channels, such as illustrated by multiple TxPIC and RxPIC chips in the modules shown in FIG. 20, and upgrade in functionality by changing in circuitry such as an upgrade of a terminal site 102 in FIG. 11 to an A/D site 114 shown in FIG. 9.

Reference is now made to the details of one embodiment comprising TxPIC 120 and RxPIC 140 which are respectively shown in FIGS. 12 and 14. As previously indicated, further details concerning the architecture, structure, operation and functionality of these PICs is set forth in U.S. Pat. No. 7,283,694; U.S. Pat. No. 7,079,715; and U.S. Pat. No. 7,116,851, all of which have been incorporated herein by reference. With reference first to FIG. 12, TxPIC comprises an InP-based semiconductor chip which includes integrated optical and electro-optic components formed as a monolithic photonic integrated circuit. Chip 120, in the case here, comprises modulated sources of laser 124 and modulators 126. Another type of modulated sources is an array of direct modulated (DM) DFB or DFB lasers. Chip 120 has a plurality of spatially aligned, integrated DFB lasers 124 each having a different operating wavelength approximated or optimized within a standardized wavelength grid, such as the ITU grid. Note that laser 124 may also be DBR lasers. There are twelve such lasers and signal channels in the embodiment shown in FIG. 12. However, there may be, for example, any number of such channels formed on the chip ranging, for example, from 4 to 40 channels depending, for example, on their close spacing within acceptable cross-talk limits. Some of these channels may be redundant channels for use in place of inoperative lasers or modulators or EMLs. These DFB lasers 124 are wavelength stabilized as taught in the above identified provisional and patent applications. Each of the 12 channels in chip 120 also includes an optical modulator 126 to modulate the light output of a respective CW operated DFB laser 124. Chip 120 may also include an optional optical array of PIN photodiodes 122 to monitor the laser power and wavelength output of each DFB laser 124. Also, an optional array of PIN photodiodes 128, respectively following each modulator 126, may be utilized to monitor the power, chirp and extinction ratio of modulator 126. The modulator 126 may be an electro-absorption modulator or a Mach-Zehnder modulator. On the other hand, it should be understood that TxPIC 120 may not include modulators 126 and semiconductor laser sources 124, albeit DFB lasers or DBR lasers, are directly modulated. As indicated before, FIGS. 12-14 are merely illustrative embodiments for TxPIC and RxPIC chips, as other configurations, as noted in the Summary of Invention, may be utilized as well as illustrated in the configurations of FIGS. 15A-15G.

Optical waveguides 129 are formed in the chip in a fan-out arrangement from PINs 128 or modulators 126 to the input slab 132 of an optical combiner 130, which is an arrayed waveguide grating (AWG) comprising input slab or free space region 132, a plurality of grating arms 134 and output slab or free space region 136 as known in the art. AWG 130 combines the modulated signals on waveguides 129 in a multiplexed signal that is provided on one of the output waveguides 138 formed in chip 120 for taking the multiplexed signal off-chip and optical coupling to an aligned optical fiber. The waveguide 138 having the best signal spectrum from AWG 130 is chosen as the output for launching onto a coupling fiber, such as coupling fiber 135 shown in FIG. 13.

FIG. 13 shows additional detail of TxPIC chip 120 of FIG. 12. It should be noted that this TxPIC chip 120 is just one embodiment of many that may be employed in a digital optical network. See, for example, the different embodiments illustrated in U.S. Pat. Nos. 7,283,694, 7,079,715, and 7,058,246, all of which have been incorporated herein by their reference. A particular example is the provision of integrated optical amplifiers on a PIC chip, such as SOAs or GC-SOAs.

To be noted is a twelve-channel chip of this size is fairly small comprising, for example, 3.5 mm by 4.5 mm. The DFB laser sources are set on center-to-center spacing of about 250 μm. Also shown are the DC biasing for PINs 122(1) . . . 122(12), DFB Laser 124(1) . . . 124(12), MODs 126(1) . . . 126(12) and PINs 128(1) . . . 128(12). On-chip heaters 125(1) . . . 125(12), which may strip heaters, for example, in proximity to each DFB laser, and are independently operated to maintain the peak operating wavelength of each laser to the prescribed wavelength of a standardized grid. Also, a heater 131 may be provided to control the wavelength grid of AWG 130 in conjunction with the control of the individual operating wavelengths of DFB lasers 124. This is explained in further detail in the above referenced provisional applications and their corresponding non-provisional applications. Lastly, each of the modulators 126 has a coaxial or coplanar electrode arrangement to provide to each MOD 126 an electrically modulated signal to each modulator 126(1) . . . 126(12) for modulating the light of the DFB lasers 124, i.e., to accomplish EO signal conversion.

Reference is now made to FIG. 14 which shows the typical layout for a RxPIC 140. It should be noted that this RxPIC chip 140 is just one embodiment of many that may be employed in a digital optical network. See, for example, the different embodiments illustrated in U.S. Pat. Nos. 7,283,694 and 7,116,851, both of which have been incorporated herein by their reference. A particular example is the provision of integrated optical amplifiers on a PIC chip, such as SOAs or GC-SOAs.

RxPIC 140 is an InP-based semiconductor chip that has an input at 145 to receive a multiplex optical signal from an optically coupled fiber link. An optical amplifier 142 may be integrated on the chip to boost the gain of the multiplexed signal prior to demultiplexing. Amplifier 142 may be a SOA or, more preferably, a gain-clamped SOA or optical laser amplifier. Such amplification can alternatively be done off-chip with an optical fiber amplifier at the input of waveguide 145. The multiplexed signal, in any case, is received on chip waveguide 147 and provided as an input to input slab or free space region 146 of AWG 144. AWG 144 comprises input slab 146, an array of grating arms 148 of different lengths and an output slab 150 as known in the art. Output slab 150 has a plurality of outputs in the first order Brillouin zone, one for each demultiplexed channel wavelength signal, which are respectively provided to PIN photodiodes 152(1) . . . 152(12). Again, although there are twelve channels shown here for chip 140, there may be as many as 4 to 40 such channel outputs from AWG 14 with corresponding photodetectors. A higher Brillouin order output channel 154 may also be provided on RxPIC chip 140 to provide a channel light output to PIN photodiode 156 in order to monitor the wavelength, power of the signals or provide for FEC capabilities.

The strategic impact in utilizing integrated optics in the form of the TxPIC and RxPIC chips 120 and 140 utilized in this invention is, by way of an example, is a decrease in cost in dollars per wavelength or channel by approximately 24 to 1 lower than a comparable conventional systems deploying discrete components as discussed earlier herein and also price competitive with conventional network, high performance analog EDFA sites.

Reference is now made to FIG. 15 which shows, in simplistic form, alternative configurations for TxPIC chip 120 and RxPIC chip 140. Portions of these chips can be formed on separate chips. For example, as shown in FIG. 15A, the arrangement shown in FIG. 12 is illustrated except without PINs 122 and 128. Chip 120A contains an array of EMLs or modulated sources 121 and chip 120B contains the optical combiner or AWG 130 and are optically coupled together, such as by butt coupling. Moreover, other types of optical combiners can be utilized in any of these embodiments such as a MMI coupler or an Echelle grating. This is the simplest form of TxPIC chip 120A with modulated sources 121 comprising DFB lasers 124 and EAMs 126. In the embodiment of FIG. 15B, the modulator of choice for modulated sources 121 for chip 120A are MZMs 162, which are to modulate the CW output light received from DFB lasers 124. In the embodiment of FIG. 15C, the modulated sources comprise DFB lasers 124, provided on chip 120A, and are direct modulated (DM) lasers which are known in the art. Their outputs are optically coupled to optical combiner 130 on chip 120B. This is the simplest form of a TxPIC chip 120 comprises an array of DFB lasers 124 and an optical combiner 130.

FIG. 15D illustrates the simplest form of a RxPIC chip 140 comprising an optical decombiner 144 on chip 140A and an array of photodetectors 152 formed on chip 140B which may be an array of PIN photodiodes or avalanche photodiodes. Again, chips 140A and 140B may be formed as a single monolithic chip 140 or chip 140B may be optically coupled, such as by butt-coupling, to chip 140B.

In The embodiment of FIG. 15E, separate EML or modulated source chips $120A_1$ and $120A_2$ are provided each with arrays of DFB lasers 124 and modulators 126. Each chip $120A_1$ and $120A_2$ may be optically coupled, such as via optical butt coupling, to optical combiner 130 formed on chip 120B. In the embodiment of FIG. 15F, optical combiner 144 on chip 140A may have its outputs optically butt coupled to two different photodiode chips $140B_1$ and $140B_2$ each having separate arrays of photodiodes 152 for detection of channel signals.

In the embodiment of FIG. 15G, a bidirectional OE REGEN 170 can be formed with four semiconductor chips 120A, 120B, 140A and 140B optical coupled as shown. Alternatively, chips 120A, 120B, 140A and 140B may be form on a single monolithic semiconductor chip 170 or as separate PIC chips 120 and 140 as illustrated in FIGS. 15A and 15D.

Reference is now made to FIG. 17 which illustrates another OEO REGEN configuration 176 of this invention. In this configuration, multiplexed signal channels are received from optical line 139, as an example, by TxPIC/RxPIC chip 140A, demultiplexed and OE converted for signal regeneration and cross-switching at digital regeneration circuits 178. The functions performed on the demultiplexed electrical signals may include 3R, A/D multiplexing, switch or route, multiplexing, such as TDM multiplexing, wavelength conversion or signal grooming as all known in the art. Re-routed signals from TxPIC/RxPIC module 104A may be switched off for transmission on optical lines 177 or 179 from regeneration circuits 178 and EO converted at TxPIC/RxPIC modules 173 and 175, respectively, multiplexed and launched on one or more optical lines 177 and 179. On the other hand, the rejuvenated channel signals may be switched to TxPIC/RxPIC chip(s) 120 and launched on optical line 140. Conversely, channel signals received from optical lines 177 and 179 are demultiplexed and OE converted at TxPIC/RxPIC modules 173 and 175 and regenerated and rerouted by regeneration/cross-switching circuits 178 to either or both of TxPIC/RxPIC modules 104A and 104B for launching on optical lines 139 and 141, respectively.

FIG. 18 illustrates various system components shown in FIGS. 7-9, 16 and 17 in a digitally amplified wavelength network (DAWN) 180 which is one of the main focuses of this invention. On the West side of DAWN 180 is terminal node or site 186 which includes TxPIC and RxPIC chips 120 and 140 and electronic linecards 110 for sending and receiving channel signals relative to optical link 188 and to provide channel signals to tributary interfaces 185 between client devices such as a network element (NE) 184, for example, a switching device, and a routing device 182. The fiber link 188 connects terminal site 186 to an optical fiber amplifier site 190. Site 190 is a standard optical fiber amplifier site for amplifying WDM channel signals propagating bidirectionally in the optical transport network. Site 190 is a high performance amplifier site that performs 2R, i.e., both optically re-amplification and reshaping of the channel signals in either direction on the network. Also, optical dispersion compensation may be performed at this site, e.g., deploying DCF. The fiber link 192 connects the optical amplifier site 190 to a digital 3R site 194 deploying OEO functionality. Site 194 is the same type of site as site 104 in FIG. 7 or the detailed structure shown in FIG. 16. Digital amplifier site 194, therefore, performs electronic signal regeneration, (re-amplification, reshaping and retiming). The fiber link 196 connects digital 3R site 194 to a digital linear A/D site 198. This site 198 is the same type of site as site 114 in FIG. 9. As indicated by the arrows in this site, a portion of the channel signals are added from or dropped to local tributary interfaces 199 to local devices such as network element (NE) 206 and router 208. The fiber link 205 connects digital linear A/D site 198 to junction node or site 210 located at the junction of multiple transmission fibers from different directions, i.e., from East, West, North and South. This site is the same type of site as site 106 in FIG. 8. The channel signals are groomed individually, or in groups, and then may be generally switched to other optical fiber links, such as indicated by arrow 222, or pass through to tributary interfaces 225 to client devices such as network element (NE) 226 and router 228 and also switched to other optical fiber links as indicated by arrow 224. The other arrows indicate other possible cross-connect paths of channel signals at junction site 210.

In all of the foregoing sites, except, of course, the optical fiber amplifier site 190, the digital DWDM components with the RxPIC and TxPIC chip components 120 and 140, such as shown in FIGS. 12 and 14, which are at the front end of the architecture fabric, are key to the digital architecture not only in terms cost competitiveness but also in terms of providing modularity to the architecture for easy and low cost upgrade of channel capacity.

It should noted that with respect to performance monitoring, the digital optical network of this invention provides for a first time increased accessibility to more points along an optical transport network than previously before in providing the ability to verify the BER on any channel at any point on the span where a low cost DON system is installed. DON provides not only immediate access to the network for upgrading but also provides closer point-to point ability to localize and isolate network errors, particularly error rates. As can be readily understood with reference to FIGS. 6C and 6D again, that DON affords now a low cost replacement of the amplifier sites 82 in FIG. 6C with digital network sites that provide immediate access to the network which can isolate errors between points of DON installations as is illustrated in FIG. 6D. As can be seen form FIG. 6C, there would be many more point along a long haul system to monitor and investigate a point providing particular problems with respect to transmission faults or errors. Thus, a main point then is that the digital optical network of this invention has many more points where the electrical signal and hence the bit error rate is accessible, so that the ability to troubleshoot span and equipment problems is greatly enhanced. Long haul systems maintain the signal in the optical domain for 600 km to 3200 km and hence pinpointing any degradation in signal quality is extremely difficult and has been a severe limitation in gaining acceptable of long haul optical systems. The ability to verify the error rate on any channel at the end of every fiber link or span or even every few spans or links or at previously installed optical amplifier sites is a tremendous advantage in network management to immediately isolate and locate points of system errors and other network faults through shorter distal links along the entire network.

Reference is now made to FIG. 19 which is a modification of the long haul span shown in FIG. 7. FIG. 19 is the same as FIG. 7 except, in addition, low cost EDFAs 230 are placed along the fiber links in the optical span between terminals 102. Since OEO REGENs 104 are deployed in lieu of conventional, discrete component OEO sets and EDFA sites, the boost in gain provided by low cost EDFAs 230 may be provided by low performance fiber amplifiers, i.e., amplifiers that have relaxed optical characteristics or parameters such as spectrum gain flattening, gain tilt, OSNR performance or noise figure, and there is no problematic characteristic of concatenated line amplifier gain spectrum reduction, gain-tilt or gain ripple accommodation. The deployment of low performance, low cost EDFAs permits a "skip one" or higher topography to be accomplished at the expense of a low performance EDFA because the channel signals will be, soon thereafter, 3R regenerated in any case. "Skip one" is a network approach of skipping the placement of one digital OEO REGEN an replacing it with an optical amplifier which may already exist or is newly inserted.

Reference is now made to FIG. 20 and digital optical network 240. Network 240, for simplicity, is illustrated as a unidirectional optical communication link, although the network could be bidirectional with the addition of RxPICs 246 in Tx module 242 and TxPICs in Rx module 244, such as illustrated in FIGS. 16 and 17. FIG. 20 illustrates an optical transport network comprising a Tx module 242 having a plurality of TxPIC chips 246 comprising TxPICs 1 through 8, which each can have 4 to 40 channels per PIC. EO signal conversion occurs in each TxPIC 246 through direct modulation of the respective DFB lasers or through modulation of on-chip optical modulators. The multiplexed channel wavelength band outputs from the respective TxPIC chips 246 are passed onto waveguides 247 to wavelength band multiplexer 248 for multiplexing all the channel bands from TxPIC chips 246 into a final multiplexed or WDM channel signal for transport on fiber link 252. In a bidirectional digital optical network, device 248 is a band MUX/DEMUX module (BMDM) to multiplex or demultiplex channel bands to and from optical link 252 as known in the art. The multiplexed signals may, then, number from 32 to 320 channels and are boosted in signal gain by post-optical amplifier 250 and launched on fiber link 252.

The multiplexed multi-band signal is then received at RxPIC Module 244 where the multiplexed signal may be initially amplified by pre-optical amplifier 254 and, thereafter, band demultiplexed or de-interleaved or both at 256 into multiplexed channel bands and the bands are then passed via optical waveguides 257 onto the individual respective RxPIC chips 258 comprising RxPICs 1-8, where they are demultiplexed into their individual channel signals for OE conversion for off-chip transfer to electronic processing circuitry. It can be seen that Tx and Rx modules 242 and 244 are compact with the deployment of plural semiconductor PIC chips 246 and 258 in modules 242 and 244.

Reference is now made to FIGS. 21 and 22. Another embodiment of a digital optical network (DON) is one that utilizes: (i) low-cost PIC transmit and/or receive module(s) for the transmission interfaces in the system either at terminals or OEO REGENs, (ii) a highly integrated signal processing chip or chip set, and (iii) low-cost PIC transmit and/or receive module(s) for tributary interfaces to customer clients. A schematic of an embodiment of a DON terminal 300 is shown in FIG. 21 and for a DON OEO REGEN site 320 is shown in FIG. 22. It should be recognized that the embodiment in FIG. 21 is similar to the digital optical network 180 shown in FIG. 18 at terminal site 186. In the embodiment in FIG. 21, PIC modules are utilized to provide very low cost OE or EO conversion on both the transmission side of the terminal 300, often referred to now as long-reach (LR), and the tributary side of the terminal 300, often referred to as short-reach (SR). The tributary SR-PIC module(s) 306 in FIG. 21 is an optical module that has either combined transmit and receive functions (transceiver) or separate transmitter or receive modules of the type previously explain herein. Each tributary transmit module is characterized by having multiple distinct electrical signal inputs 308 and multiple distinct optical fiber signal outputs 310 which are routed to multiple physical locations of a client or clients. Similarly, each tributary receiver module is characterized by having multiple distinct optical fiber signal inputs 312 from different locations and multiple electrical signal outputs 314. For a PIC tributary transceiver, these are combined in one module. Also, note that a transmitter, receiver, or transceiver 306 in FIG. 21 may also be replaced with multiple transmitters, receivers, or transceivers that each may have multiple channels per module. The tributary modules are then interfaced to integrated electronic processing circuits 304 which are then interfaced to the transmission LR-PIC modules 302 via electrical signal inputs 316 and optical signal outputs 318. The integrated electronic processing circuits 304 comprises either a single IC chip in the most preferred embodiment or a IC chip set, that contain, in either case, more than one of the following functions on a given chip: clock and data recovery (CDR), serializing and deserializing (SERDES), forward error correction (FEC), crosspoint switching, and electronic signal compensation, i.e., equalization of frequency dependent attenuation of the electrical signal pulse or skew or GVD of the optical signal pulse, framing, and associated switching fabric. Furthermore, it is preferred that the single IC chip embodiment include all of the above identified functions for all signal channels on a single chip. Alternatively, multiple chips may be utilized to cover either multiple channels and/or multiple groups of functions. This DON terminal 300 is described as an ultimate terminal architecture in that it has a minimum number of optical-electronic and electronic components and hence has advantages of low cost with accompanying higher density. The minimum cost is realized by virtue of the minimum number of such components which reduces the total component cost. Furthermore, the manufacturing cost is reduced since the number of components is reduced, reducing the complexity of the manufacturing process. The improved density of such a system has several advantages. First, the footprint of the system is dramatically reduced with less components, which reduces the overall space requirements for carrier providers. Furthermore, the increase in density means that an increased number of optical and electrical components can be implemented on a given system board in a carrier provider's rack. The ability to implement an increased number of functions of the components on a single board for a group of signal channels is extremely advantageous in that it eliminates or otherwise greatly reduces the backplane complexity of the telecom system. Sending high-speed signals across the backplane of a telecom system results in significantly increased cost and complexity. In the ultimate case, the tributary interfaces, electronic processing, and transmission interface functions are captured on a single PC board. The ability to accomplish this task is enabled by having high-density components LR-PIC and SR-PIC chip modules. Without the improved density of these modules, the integrated electronic processing chip(s) are of significantly diminished value or may not even be feasible in a telecom system. The density of the PIC chips translates into the decreased distance that high-speed signals must be routed on a PC board before they reach the integrated electronic processing chip(s). Without PIC chips, signals at the line rate of the system must be routed over significant distances on the board, resulting in substantial degradation of the transported signals and increased cost and complexity of the board itself. Thus, the PIC modules enable the utilization of low cost integrated electronic processing chips in a digital optical network.

The foregoing also applies to a DON OEO REGEN site which is shown in FIG. 21. The OEO regen site 320 is similar to terminal 300 with the exception that the tributary SR-PIC modules 306 are replaced with transmission LR-PIC modules 322. All of the advantages stated above for DON terminal 300 similarly apply to DON OEO REGEN site 320. In FIG. 22, West to East bound traffic, $\lambda_i \ldots \lambda_N$, is received by LR-PIC modules(s) 322 which provides electrical signal outputs 326 to integrated electronic processing circuits 328. Circuits 328 provide an electrical signal output 332 to another or other LR-PIC module(s) 322 to provide optical signal outputs, $\lambda_i \ldots \lambda_N$, for East bound traffic. By the same token, East to West bound traffic, $\lambda_j \ldots \lambda_M$, is received by LR-PIC modules (s) 322 which provides electrical signal outputs 330 to integrated electronic processing circuits 328. Circuits 328 provide an electrical signal output 324 to another or other LR-PIC module(s) 322 to provide optical signal outputs, $\lambda_j \ldots \lambda_M$, for West bound traffic.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. An optical transport network comprising:
an optical transmitter module comprising:
a first Group III-V semiconductor chip,
an array of modulated sources provided on the first Group III-V semiconductor chip, each of the modulated sources providing a corresponding one of a plurality of optical channels;
an optical multiplexer provided on the first Group III-V semiconductor chip and coupled to the modulated sources for providing a multiplexed signal including the plurality of optical channels, and
a waveguide provided on the first Group IIIV semiconductor chip and coupled to the optical multiplexer, the waveguide being configured to receive the multiplexed signal from the optical multiplexer and output the multiplexed signal; and
an optical receiver module comprising:
a second Group III-V semiconductor chip,
an optical demultiplexer provided on the second Group III-V semiconductor chip, for demultiplexing the multiplexed signal, and
a plurality of optical detection elements provided on the second Group III-V semiconductor chip and coupled to the optical demultiplexer, each of the plurality of optical detection elements configured to receive a corresponding one of the plurality of optical channels output from the optical demultiplexer, the optical detection elements being configured to output a plurality of electrical signals in response to the plurality of optical channels.

2. The optical transport network of claim 1 wherein the optical detection elements are photodetectors.

3. The optical transport network of claim 1 wherein the optical detection elements are PIN photodiodes or avalanche photodiodes.

4. The optical transport network of claim 1 wherein the modulated sources are directly modulated laser sources.

5. The optical transport network of claim 4 wherein the direct modulated laser sources comprise DFB lasers, DB lasers, tunable DFB or DBR lasers.

6. The optical transport network of claim 1 wherein the modulated sources comprise laser sources coupled to electro-optic modulators.

7. The optical transport network of claim 6 wherein the laser sources include DFB lasers, DBR lasers, tunable DFB or DBR lasers and the electro-optic modulators include electro-absorption modulators or Mach-Zehnder modulators.

8. The optical transport network of claim 1 wherein the optical multiplexer comprises a star coupler, a MMI coupler, an Echelle grating or an arrayed waveguide grating.

9. The optical transport network of claim 1 wherein the optical demultiplexer comprises a start coupler, a MMI coupler, an Echelle grating or an arrayed waveguide grating.

* * * * *